(12) United States Patent
Campi et al.

(10) Patent No.: US 8,168,500 B2
(45) Date of Patent: May 1, 2012

(54) DOUBLE GATE DEPLETION MODE MOSFET

(75) Inventors: John B. Campi, Westford, VT (US); Richard A. Phelps, Colchester, VT (US); Robert M. Rassel, Colchester, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/013,311

(22) Filed: Jan. 25, 2011

(65) Prior Publication Data

US 2011/0117711 A1 May 19, 2011

Related U.S. Application Data

(62) Division of application No. 11/972,811, filed on Jan. 11, 2008, now Pat. No. 7,902,606.

(51) Int. Cl.
*H01L 21/336* (2006.01)
*H01L 29/78* (2006.01)

(52) U.S. Cl. .......................... 438/283; 438/297; 438/301

(58) Field of Classification Search .................. 438/283, 438/297, 301
See application file for complete search history.

(56) References Cited

U.S. PATENT DOCUMENTS

| | | | |
|---|---|---|---|
| 4,226,648 A | 10/1980 | Goodwin et al. | |
| 4,786,952 A | 11/1988 | MacIver et al. | |
| 4,827,319 A | 5/1989 | Pavlidis et al. | |
| 5,557,140 A | 9/1996 | Nguyen et al. | |
| 6,118,152 A | 9/2000 | Yamaguchi et al. | |
| 6,521,506 B1 | 2/2003 | Coolbaugh et al. | |
| 6,559,502 B2 | 5/2003 | Hueting et al. | |
| 6,876,035 B2 | 4/2005 | Abadeer et al. | |
| 7,183,628 B2 * | 2/2007 | Coolbaugh et al. | 257/595 |
| 2003/0003643 A1 * | 1/2003 | Bromberger et al. | 438/200 |
| 2003/0038307 A1 | 2/2003 | Watanabe et al. | |
| 2004/0082133 A1 * | 4/2004 | Salling et al. | 438/301 |
| 2004/0155257 A1 | 8/2004 | Yashita | |
| 2005/0151171 A1 | 7/2005 | Hao et al. | |
| 2005/0161770 A1 | 7/2005 | Coolbaugh et al. | |
| 2005/0258461 A1 | 11/2005 | Wang et al. | |
| 2005/0263800 A1 | 12/2005 | Kwon et al. | |
| 2006/0098365 A1 | 5/2006 | Harris et al. | |
| 2006/0145300 A1 | 7/2006 | Coolbaugh et al. | |
| 2006/0289933 A1 | 12/2006 | Gossner | |
| 2007/0040212 A1 | 2/2007 | Cai et al. | |
| 2008/0023760 A1 | 1/2008 | Ito et al. | |
| 2009/0020813 A1 * | 1/2009 | Voldman | 257/343 |
| 2009/0068804 A1 * | 3/2009 | Pendharkar | 438/195 |

* cited by examiner

*Primary Examiner* — Jerome Jackson, Jr.
*Assistant Examiner* — David Spalla
(74) *Attorney, Agent, or Firm* — Scully, Scott, Murphy & Presser, P.C.; Richard M. Kotulak, Esq.

(57) ABSTRACT

A metal-oxide-semiconductor field effect transistor (MOSFET) has a body layer that follows the contour of exposed surfaces of a semiconductor substrate and contains a bottom surface of a shallow trench and adjoined sidewalls. A bottom electrode layer vertically abuts the body layer and provides an electrical bias to the body layer. A top electrode and source and drain regions are formed on the body layer. The thickness of the body layer is selected to allow full depletion of the body layer by the top electrode and a bottom electrode layer. The portion of the body layer underneath the shallow trench extends the length of a channel to enable a high voltage operation. Further, the MOSFET provides a double gate configuration and a tight control of the channel to enable a complete pinch-off of the channel and a low off-current in a compact volume.

20 Claims, 17 Drawing Sheets

DOUBLE GATE DEPLETION MODE MOSFET

CROSS REFERENCE TO RELATED APPLICATION

This application is a divisional of U.S. patent application Ser. No. 11/972,811, filed Jan. 11, 2008 the entire content and disclosure of which is incorporated herein by reference.

FIELD OF THE INVENTION

The present invention relates to semiconductor structures and particularly to depletion mode metal-oxide-semiconductor field effect transistor (MOSFETs) having a double gate configuration, and methods of manufacturing the same.

BACKGROUND OF THE INVENTION

Solid state power amplifiers are advantageous for their compact size and easy integration into semiconductor circuit components. Unfortunately, methods of manufacture for present day semiconductor power amplifiers require a semiconductor substrate dedicated to power amplifier devices or many processing steps in addition to common semiconductor processing steps for typical semiconductor complementary metal-oxide-semiconductor (CMOS) devices or their variants.

For example, high-end power amplifiers are built in gallium arsenide (GaAs) technologies, which require a GaAs substrate and dedicated processing steps that are not compatible with silicon-based CMOS technologies. As a result, the power amplifiers that utilize GaAs technologies tend to be costly. Middle-range power amplifiers are built in modified silicon germanium bipolar complementary metal-oxide-semiconductor (SiGe BiCMOS) technologies developed for high voltage power applications. Even modified SiGe BiCMOS technologies tend to add its own cost associated with enabling power amplifiers.

While, CMOS devices such as lateral diffusion metal-oxide-semiconductor field effect transistors (LDMOSFETs) have been proposed to provide a silicon based power amplifier devices, enabling power amplifiers in standard CMOS technologies also tends to introduce many new processing steps and device modifications to accommodate the high voltages that the power amplifiers require, thus also increasing the manufacturing cost for the power amplifiers. Specifically, prior art CMOS devices for power applications typically require multiple additional mask sets in addition to the masks required to manufacture standard CMOS devices, which tends to drive the manufacturing cost significantly.

In view of the above, there exists a need for a semiconductor structure that provides high voltage power amplification and requires minimal number of additional mask sets and additional processing steps, and methods of manufacturing the same.

Further, fully depleted devices having a tight control of the current through the channel is known to provide superior performance in MOSFETs. Thus, there exists a need for a MOSFET that provides high voltage power amplification and a tight control of the channel, and methods of manufacturing the same.

SUMMARY OF THE INVENTION

The present invention addresses the needs described above by providing a depletion mode metal-oxide-semiconductor field effect transistor having dual gates that control the channel from above and from below.

Specifically, the present invention provides a metal-oxide-semiconductor field effect transistor (MOSFET) having a body layer that follows the contour of exposed surfaces of a semiconductor substrate that contain a bottom surface of a shallow trench and adjoined sidewalls. A bottom electrode layer vertically abuts the body layer and provides an electrical bias to the body layer. A primary isolation well layer electrically isolates the bottom electrode layer from a substrate layer. The bottom electrode layer is biased through a bottom electrode contact well, and the primary isolation well layer is biased through a secondary isolation well layer and an isolation layer contact well. A top electrode and source and drain regions are formed on the body layer. The thickness of the body layer is selected to allow full depletion of the body layer by the top electrode and a bottom electrode layer. The portion of the body layer underneath the shallow trench extends the length of a channel to enable a high voltage operation. Further, the inventive MOSFET provides a double gate configuration and a tight control of the channel to enable a complete pinch-off of the channel and a low off-current in a compact volume.

According an aspect of the present invention, a semiconductor structure is provided, which comprises:
  a first shallow trench isolation (STI) portion and a second STI portion, wherein the first STI portion and the second STI portion are located beneath a substrate top surface of a semiconductor substrate and separated from each other;
  a body layer comprising a semiconductor material, and abutting a surface region of the substrate top surface between the first STI portion and the second STI portion, a bottom surface of the second STI portion, and a pair of sidewalls of the second STI portion directly adjoined to opposite ends of the bottom surface of the second STI portion;
  a bottom electrode layer comprising the semiconductor material, vertically abutting the body layer, located in the semiconductor substrate;
  a gate dielectric abutting the substrate top surface; and
  a top gate electrode abutting the gate dielectric, wherein the bottom electrode layer has a doping of a first conductivity type and the body layer has a doping a second conductivity type, and wherein the second conductivity type is the opposite of the first conductivity type.

A resistivity of a body layer sidewall region of the body region may be from about 2 to 20 times greater than a resistivity of body layer top regions of the body region.

In one embodiment, the semiconductor structure further comprises:
  a source region abutting the first STI portion and the body layer; and
  a drain region abutting the second STI portion and another surface region of the substrate top surface, wherein each of the source region and the drain region has a doping of the second conductivity type.

In another embodiment, the semiconductor structure further comprises:
  a bottom electrode contact well laterally abutting the bottom electrode layer and having a doping of the first conductivity type; and
  a bottom electrode contact region vertically abutting the bottom electrode contact well and yet another surface region of the substrate top surface and having a doping of the first conductivity type.

In even another embodiment, the bottom electrode contact well laterally abuts the body layer directly underneath a shallow trench isolation portion.

In yet another embodiment, the semiconductor structure further comprises:
- a primary isolation well layer located directly beneath the bottom electrode layer and having a doping of the second conductivity type;
- a secondary isolation well layer located directly beneath the bottom electrode contact region, laterally abutting the primary isolation well layer, and having a doping of the second conductivity type; and
- an isolation layer contact well laterally abutting the secondary isolation well layer and having a doping of the second conductivity type.

In still another embodiment, the isolation layer contact well laterally abuts the bottom electrode contact region.

In still yet another embodiment, the semiconductor structure further comprises an isolation layer contact region abutting the isolation layer contact well and still another surface region of the substrate top surface and having a doping of the second conductivity type.

In a further embodiment, the semiconductor structure further comprises a substrate layer abutting the primary isolation well layer, the secondary isolation well layer, the isolation layer contact well, and having a doping of the first conductivity type.

In an even further embodiment, the substrate layer, the primary isolation well layer, the secondary isolation well layer, the isolation layer contact well, the bottom electrode contact well, the bottom electrode layer, and the body layer are single crystalline and epitaxially aligned.

In a yet further embodiment, the gate dielectric abuts the surface region of the substrate top surface and a top surface of the second dielectric portion.

In a still further embodiment, a first portion of the body layer vertically abutting the gate electrode and a second portion of the body layer vertically abutting the bottom surface of the second STI portion have a same first thickness.

In a still yet further embodiment, the semiconductor structure further comprises a bottom electrode contact well laterally abutting the bottom electrode layer, wherein a first portion of the bottom electrode layer vertically abutting the first portion of the body layer and a second portion of the bottom electrode layer vertically abutting the second portion of the body layer have a same second thickness.

In a further another embodiment, the semiconductor structure further comprises a primary isolation well layer located directly beneath the bottom electrode layer, wherein a first portion of the primary isolation well layer vertically abutting the first portion of the bottom electrode layer and a second portion of the primary isolation well layer vertically abutting the second portion of the bottom electrode layer have a same third thickness.

According to another aspect of the present invention, a method of manufacturing a semiconductor structure is provided, which comprises:
- forming a shallow trench including a first shallow trench portion and a second shallow trench portion in a semiconductor substrate, wherein the first shallow trench portion and the second shallow trench portion are separated by a first surface region of a semiconductor top surface;
- forming a stack of a body layer, a bottom electrode layer, and a primary isolation well layer, wherein the body layer is located directly beneath the first surface region, a second surface region directly adjoining the second shallow trench portion, and a bottom surface of the second shallow trench portion, and wherein the bottom electrode layer is located directly beneath the body layer, and wherein the primary isolation layer is located directly beneath the bottom electrode layer, and wherein the bottom electrode layer has a doping of a first conductivity type, and wherein each of the body layer and the primary isolation well layer has a doping a second conductivity type, and wherein the second conductivity type is the opposite of the first conductivity type;
- forming a shallow trench isolation (STI) structure including a first STI portion formed in the first shallow trench portion and a second STI portion formed in the second shallow trench portion; and
- forming a gate dielectric and a top gate electrode by patterning a stack of a gate dielectric layer and a gate electrode layer, wherein the gate dielectric is formed on a portion of the first surface region and the second STI portion.

In one embodiment, the method further comprises forming a patterned ion implantation mask on the semiconductor top surface prior to the forming the stack, wherein the first surface region of the semiconductor top surface, the second shallow trench portion, and a second surface region of the semiconductor top surface are exposed, wherein the second surface region directly adjoins a sidewall of the second shallow trench portion.

In another embodiment, the method further comprises:
- forming a source region and a drain region, wherein the source region is formed directly on the first STI portion and directly underneath the first surface region of the top surface; and
- forming a drain region directly on the second STI portion and directly underneath the second surface region of the substrate top surface, wherein the source region and the drain region are disjoined from the bottom electrode layer, wherein each of the source region and the drain region has a doping of the second conductivity type.

In even another embodiment, the method further comprises:
- forming a bottom electrode contact well having a doping of the first conductivity type directly on the bottom electrode layer; and
- forming a secondary isolation well layer having a doping of the second conductivity type directly beneath the bottom electrode contact region and directly on the primary isolation well layer.

In yet another embodiment, the method further comprises forming an isolation layer contact well having a doping of the second conductivity type directly on the secondary isolation well layer.

In still another embodiment, the method further comprises:
- forming a bottom electrode contact region having a doping of the first conductivity type in the bottom electrode contact well and directly beneath a third surface region of the substrate top surface; and
- forming an isolation layer contact region having a doping of the second conductivity type in the isolation layer contact well and directly beneath a fourth surface region of the substrate top surface concurrently with the forming of the source region and the drain region.

In a further embodiment, a first portion of the body layer vertically abutting the gate electrode and a second portion of the body layer vertically abutting the bottom surface of the second STI portion have a same first thickness, and a first portion of the bottom electrode layer vertically abutting the first portion of the body layer and a second portion of the bottom electrode layer vertically abutting the second portion of the body layer have a same second thickness, and a first portion of the primary isolation well layer vertically abutting the first portion of the bottom electrode layer and a second portion of the primary isolation well layer vertically abutting the second portion of the bottom electrode layer have a same third thickness.

In an even further embodiment, an angled ion implantation with four rotations is employed to form the body layer, wherein a body layer sidewall region of the body layer receives a dosage of dopant ions corresponding to only one rotation.

In a yet further embodiment, body layer top regions of the body layer receives 100% of a total dosage of the angled ion implantation with four rotations.

In a still further embodiment, body layer bottom region of the body layer receives a dosage corresponding to a percentage from about 55% to 100% of the total dosage of the angled ion implantation with four rotations.

In a still yet further embodiment, the body layer sidewall region receives a dosage corresponding to a percentage from about 5% to about 45% of the total dosage of the angled ion implantation with four rotations.

In further another embodiment, a resistivity of the body layer sidewall region is from about 2 to 20 times greater than a resistivity of the body layer top regions.

BRIEF DESCRIPTION OF THE DRAWINGS

FIGS. 1, 2, 4, 5A-11A are sequential vertical cross-sectional views of an exemplary semiconductor structure according to the present invention.

DETAILED DESCRIPTION OF THE INVENTION

Figure 1:
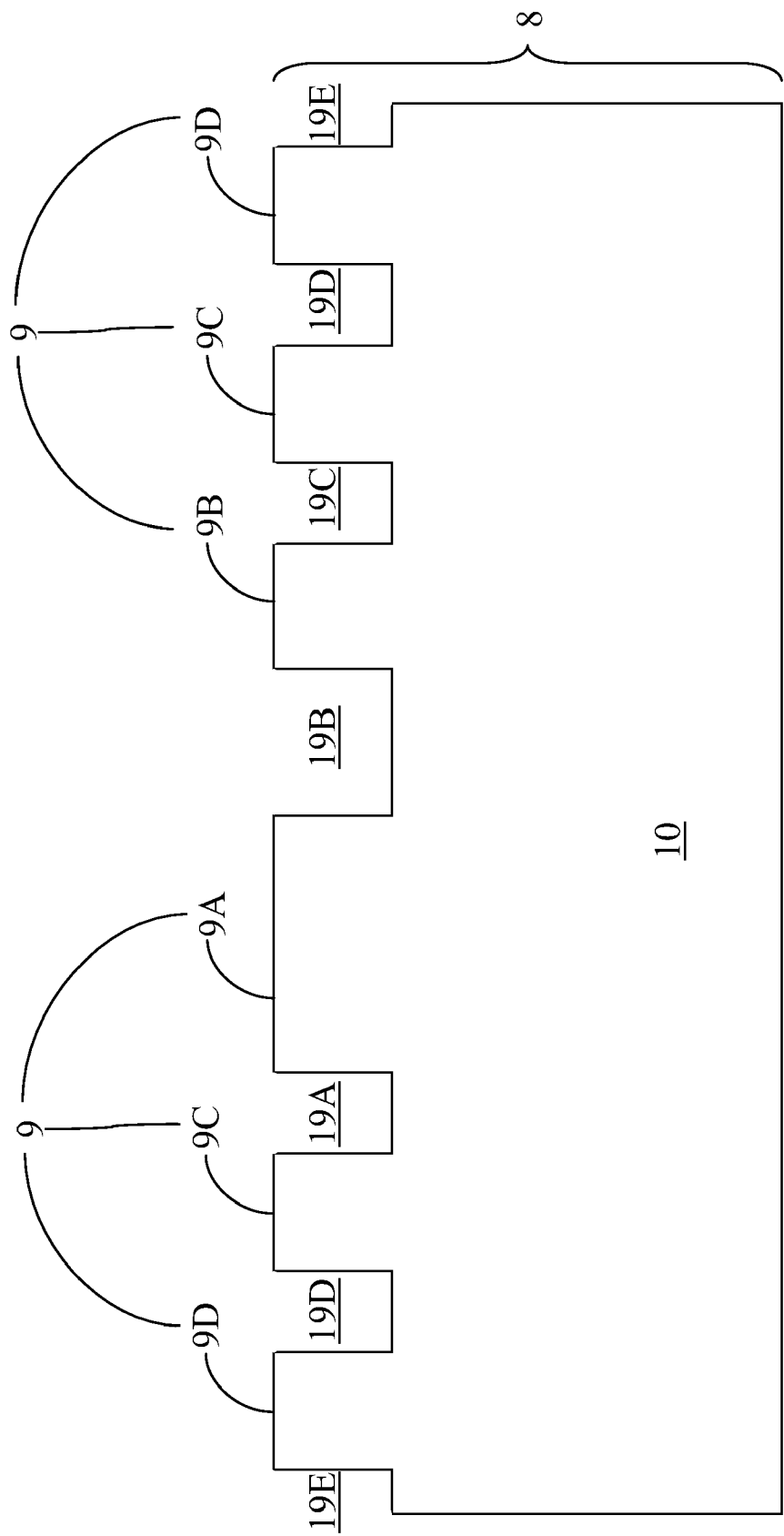

As stated above, the present invention relates to a depletion mode metal-oxide-semiconductor field effect transistor (MOSFETs) having a double gate configuration, and methods of manufacturing the same, which are now described in detail with accompanying figures. It is noted that like and corresponding elements are referred to by like reference numerals.

Referring to FIG. 1, an exemplary semiconductor structure according to the present invention comprises a semiconductor substrate 8 containing a substrate layer 10. Preferably, the substrate layer 10 comprises a standard complementary metal oxide semiconductor (CMOS) substrate material such as silicon, germanium, silicon-germanium alloy, silicon carbon alloy, and silicon-germanium-carbon alloy. However, the present invention may be practiced with a semiconductor substrate 8 with an alternate semiconductor material such as gallium arsenide, indium arsenide, indium phosphide, III-V compound semiconductor materials, II-VI compound semiconductor materials, organic semiconductor materials, and other compound semiconductor materials. Preferably, the substrate layer 10 is single crystalline, i.e., atoms are epitaxially aligned in a single crystalline lattice within the substrate layer 10.

The semiconductor substrate 8 may be a bulk substrate, a top semiconductor portion of a semiconductor-on-insulator (SOI) substrate above a buried insulator layer, or a hybrid substrate with both at least one bulk portion and at least one SOI portion.

The substrate layer 10 is doped with dopants of a first conductivity type. The first conductivity type may be p-type or n-type. The dopant species may be B, In, Ga, or a combination thereof for p-type doping, or alternatively, may be P, As, Sb, or a combination thereof for n-type doping. The dopant concentration of the substrate layer 10 is typically from about $3.0 \times 10^{15}/cm^3$ to about $3.0 \times 10^{17}/cm^3$.

The top surface of the semiconductor substrate 8 contains at least one shallow trench that includes a first shallow trench portion 19A, a second shallow trench portion 19B, a third shallow trench portion 19C, at least one, fourth shallow trench portion 19D, and at least one fifth shallow trench portion 19E, all of which are formed into the substrate layer 10. The first shallow trench portion 19A is separated from the second shallow trench portion 19B by a first surface region 9A of a semiconductor top surface 9. The second shallow trench portion 19B is separated from the third shallow trench portion 19C by a second surface region B of the semiconductor top surface 9. Each of the at least one, fourth trench 19D is separated from the first shallow trench portion 19A or the third shallow trench portion 19C by one of at least one, third surface region 9C of the semiconductor top surface 9. Each of the at least one fifth trench 19E is separated from one of the at least one, fourth shallow trench 19D by one of at least one, fourth surface region 9D of the semiconductor top surface 9.

The first surface region 9A, the second surface region 9B, the at least one, third surface region 9C, and the at least one, fourth surface region 9D are substantially coplanar and collectively constitute the semiconductor top surface 9. The first shallow trench portion 19A, the second shallow trench portion 19B, the third shallow trench portion 19C, the at least one, fourth shallow trench portion 19D, and the at least one fifth shallow trench portion 19E collectively constitute the at least one shallow trench (19A-19E), which may be formed by methods known in the art. The at least one shallow trench (19A-19E) has a depth from about 100 nm to about 800 nm, and typically from about 150 nm to about 600 nm, and more typically from about 200 nm to about 450 nm, although lesser and greater depths are also explicitly contemplated herein. The sidewalls of each of the at least one shallow trench (19A-19E) may be substantially vertical or may have a built in taper. A pair of sidewalls are directly adjoined to opposite ends of a bottom surface of each of the at least one shallow trench (19A-19E), which may be globally connected as one piece by surrounding the various surface regions (9A-9D), or may be in multiple disjoined portions.

Figure 2:
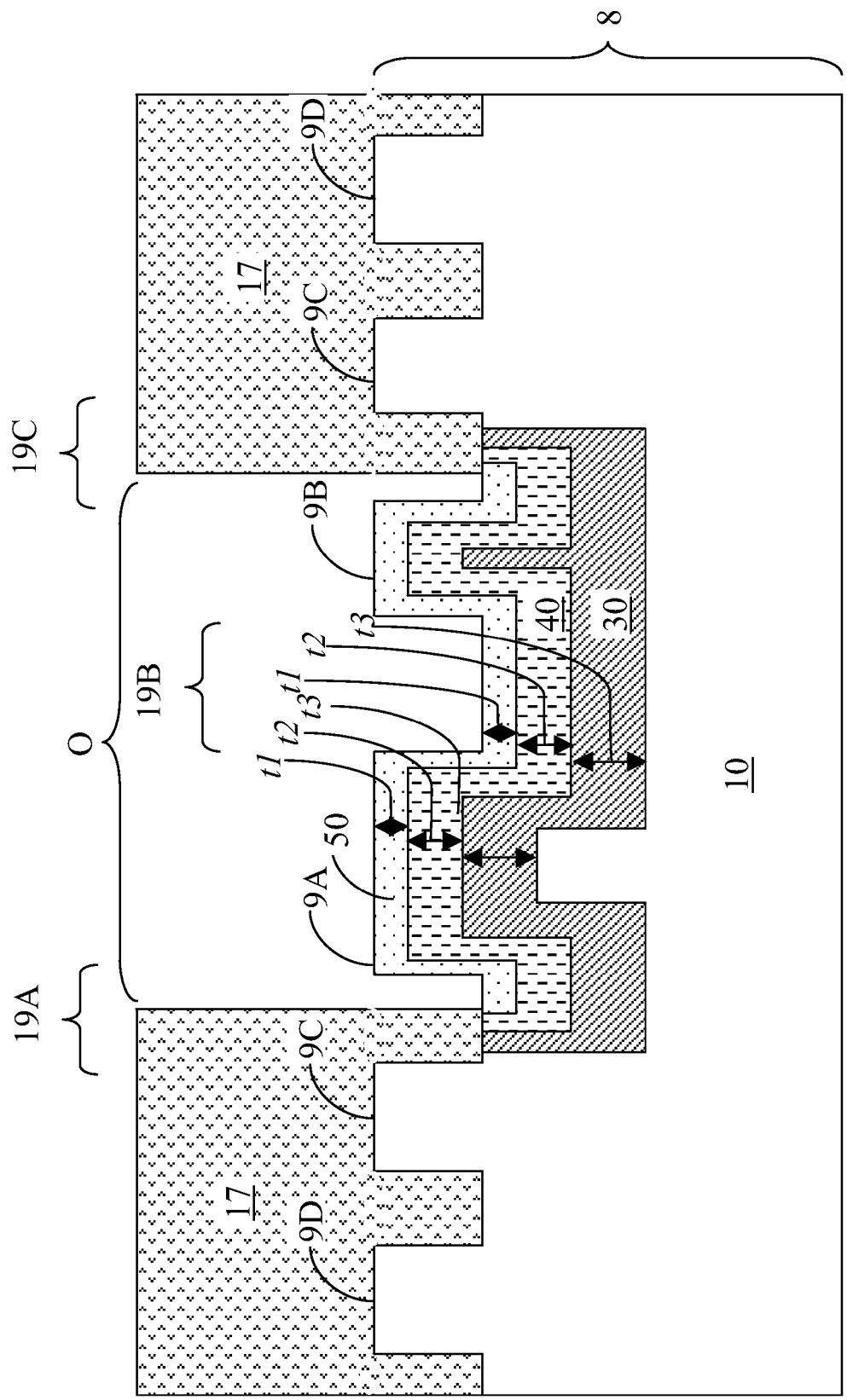

Referring to FIG. 2, a first implantation mask 17, which may be a layer of photoresist, is formed on the semiconductor top surface (9A-9D) and lithographically patterned such that an opening O in the first implantation mask 17 contains the first surface region 9A, the second surface region 9B, and the first shallow trench portion 19A. Specifically, a bottom surface of the first shallow trench portion 19A and a pair of sidewalls directly adjoined to two opposite ends of the bottom surface of the second shallow trench portion 19A are exposed. Preferably, a portion of the first shallow trench portion 19A (See FIG. 1) and a portion of the third shallow trench portion 19C (See FIG. 1) are also exposed.

A series of ion implantation steps are performed employing the first implantation mask 17 to deliver dopants into the portion of the substrate layer 10 within the opening O in the implantation mask 17, while blocking dopants from entering the substrate layer 10 outside the opening O. A vertical stack of a body layer 50, a bottom electrode layer 40, and a primary isolation well layer 30 are formed in the substrate layer 10. The body layer 50 has a doping of a second conductivity type, which is the opposite of the first conductivity type. For example, in case the first conductivity type is p-type, the second conductivity type is n-type, and vice versa. The bottom electrode layer 40 has a doping of the first conductivity type. The primary isolation well layer 30 has a doping of the second conductivity type.

The vertical stack of a body layer 50, a bottom electrode layer 40, and a primary isolation well layer 30 employ at least two ion implantation steps, which may be performed in any order. Dopants of the second conductivity type are implanted into the substrate layer 10 within the opening O to form the body layer 50 and the primary isolation well layer 30. Dopants of the first conductivity type are implanted into the substrate layer 10 within the opening O to form the bottom electrode layer 40.

The energy and angle of the implanted dopant ions are adjusted such that each layer within the vertical stack is formed at a desired depth. The body layer 50 is formed directly beneath the exposed surfaces of the semiconductor substrate 8. The contour of the bottom surface of the body layer 50 approximately follows the contour of the exposed surface of the semiconductor substrate 8 within the opening O with lateral displacements of sidewalls inward from each of exposed portions of the at least one shallow trench (19A-19C) toward the center of the first surface region 9A or the center of the second surface region 9B. This is effected by adjusting the energy, dose, and tilt angle of the various ion implantation steps so that adequate lateral straggle, or lateral diffusion, of the implanted dopants occurs as the ions lose energy in the substrate layer 10. For example, the tilt angle of the ion implantation process may be adjusted between 0° and 60° to insure adequate contiguity of the body layer 50.

Thus, the entirety of the body layer 50 is contiguous. Further, horizontal portions of the body layer 50 have the same thickness, which is herein referred to as a first thickness t1. Specifically, a first portion of the body layer 50 vertically abutting the first surface region 9A and a second portion of the body layer 50 vertically abutting the bottom surface of the second STI portion 19B have the same thickness, which is the first thickness t1. The first thickness t1 may be from about 30 nm to about 500 nm, and preferably from about 100 nm to about 300 nm, although lesser and greater thicknesses are explicitly contemplated herein. The body layer 50 has a doping of the second conductivity type. The dopant concentration of the body layer 50 is from about $1.0 \times 10^{16}/cm^3$ to about $3.0 \times 10^{19}/cm^3$, and preferably in the range from about $3.0 \times 10^{17}/cm^3$ to about $1.0 \times 10^{19}/cm^3$, although lesser and greater dopant concentrations are also explicitly contemplated herein.

Figure 3:
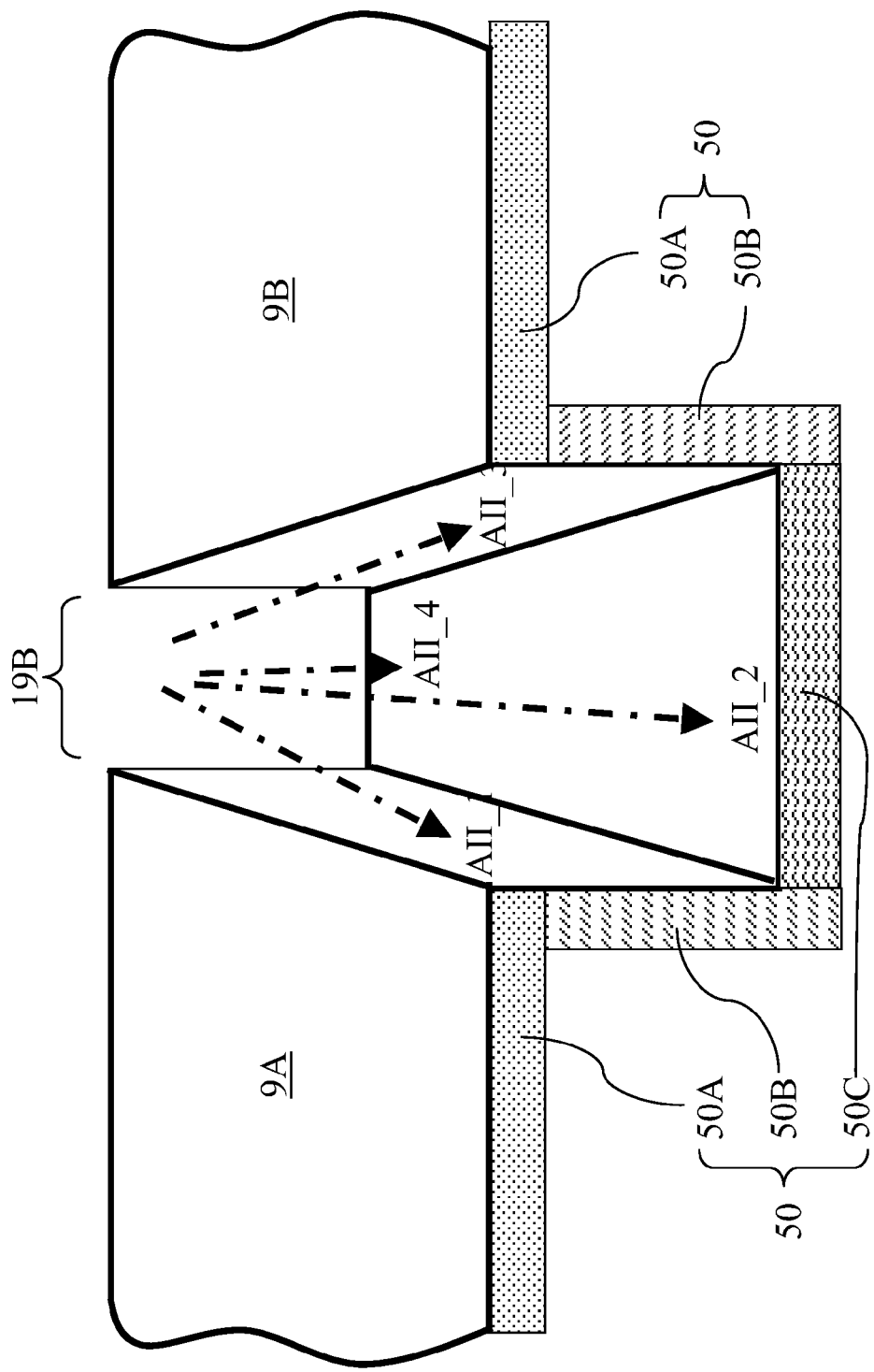
FIG. 3 is an angled cross-sectional view of the exemplary semiconductor structure showing a first surface region 9A, a second surface region 9B, and the body layer 50 at a step corresponding to FIG. 2.

Referring to FIG. 3, the method of the implantation utilizes an angled ion implantation with four rotations, which are labeled AII_1, AII_2, AII_3, and AII_4, respectively. The angles of the four rotations are adjusted such that the sidewall regions for the body implant receives only one rotation of the total angled ion implantation. The dose of ion implantation during each rotation may be the same, or different. Body layer top regions 50A, which are the portions of the body layer 50 directly underneath the top surface of the semiconductor substrate, receives all of the four rotations of the angled ion implantation. Thus, the dosage of angled ion implantation in the body layer top region 50A is 100% of the total angled ion implantation dosage.

Body layer sidewalls regions 50B have a dopant concentration corresponding to only one rotation of the angled ion implantation. If all rotations have an equal does, the dosage of the body layer sidewall regions 50B is about 25% of the total ion implantation dosage. If rotations of angles ion implantations have different doses, the dosage of the body layer sidewall regions 50B may be from about 5% to about 45% of the total angled ion implantation dosage, which is lower than the dosage of the body layer top portions 50A by a percentage from about 55% to about 95%. Thus, the sheet resistance of the body layer sidewall regions 50B may be from about 2 to about 20 times higher, and is typically about 4 times higher, than the sheet resistance of the body layer top region 50A.

The dosage of angled ion implantation in a body layer bottom region 50C is between combined doses of two rotations and the total angled ion implantation dosage of all four rotations. Thus, the dosage in the body layer bottom region 50C may be between 50% and 100% of the total angled ion implantation dosage if all four rotations have the same dose, and may be from about 25% to about 100% if the four rotations have different doses. Thus, the sheet resistance of the body layer bottom region 50C may be from about 1 to about 4 times higher, and is preferably greater than the sheet resistance of the body layer top regions 50A by no less than 50%.

The differences in the sheet resistance between the vertical portions of the body region 50, i.e., the body layer sidewall regions 50B, and horizontal portions of the body region 50, i.e., the body layer top regions 50A and the body layer bottom region 50C, allows the device to utilize the STI trench profile to extend the effective distance of the n-channel to the drain region which then allows for high drain voltage without degrading the oxide integrity. In other words, the higher sheet resistance of the body layer sidewall regions 50B effectively increases the length of the body layer 50 at the body layer sidewall regions 50B due to the higher resistivity, which is effected by the reduced dosage of implanted dopant ions.

The bottom electrode layer 40 is formed directly beneath the body layer 50, i.e., a top surface of the bottom electrode layer 40 coincides with a bottom surface of the body layer 50. The entirety of the bottom electrode layer 40 is contiguous, which is effected by adjusting the energy, dose, and tilt angle of the various ion implantation steps so that adequate lateral straggle, or lateral diffusion, of the implanted dopants occurs as during the formation of the bottom electrode layer 50.

As in the structure of the body layer 50, horizontal portions of the bottom electrode layer 40 have the same thickness, which is herein referred to as a second thickness t2. Specifically, a first portion of the bottom electrode layer 40 vertically abutting the first portion of the body layer 50 and a second portion of the bottom electrode layer 40 vertically abutting the second portion of the body layer 50 have the same thickness, which is the second thickness t2. The second thickness t2 may be from about 100 nm to about 500 nm, and preferably from about 200 nm to about 300 nm, although lesser and greater thicknesses are explicitly contemplated herein. The second thickness t2 may be from about 100 nm to about 500 nm, and preferably from about 200 nm to about 300 nm, although lesser and greater thicknesses are explicitly contemplated herein. The bottom electrode layer 40 has a doping of the first conductivity type. The dopant concentration of the bottom electrode layer 40 is from about $3.0 \times 10^{15}/cm^3$ to about $3.0 \times 10^{19}/cm^3$, and typically from about $1.0 \times 10^{16}/cm^3$ to about $3.0 \times 10^{18}/cm^3$.

The primary isolation well layer 30 is formed directly beneath the bottom electrode layer 40, i.e., a top surface of the primary isolation layer 30 coincides with a bottom surface of the bottom electrode layer 50. The entirety of the primary isolation well layer 30 can be contiguous, but is not necessarily required as long as the entire region can sufficiently isolate the bottom electrode layer 40 from the bulk substrate 10. A contiguous isolation well layer 30 is effected by adjusting the energy, dose, and tilt angle of the various ion implantation steps so that adequate lateral straggle, or lateral diffusion, of the implanted dopants occurs as during the formation of the primary isolation well layer 30. Another technique to provide electrical isolation from the bottom electrode layer 50 and the substrate 10 would be a separate isolation well and layer 34i which can be formed in a manner similar to the deep isolation well from CMOS processing and if available and appropriate could utilize and share this isolation well.

As in the structure of the bottom electrode layer 40, horizontal portions of the primary isolation well layer 30 have the same thickness, which is herein referred to as a third thickness t3. Specifically, a first portion of the primary isolation well layer 30 vertically abutting the first portion of the bottom electrode layer 40 and a second portion of the primary isolation well layer 30 vertically abutting the second portion of the bottom electrode layer 40 have the same thickness, which is the third thickness t3. The third thickness t3 may be from about 100 nm to about 600 nm, and preferably from about 200 nm to about 500 nm, although lesser and greater thicknesses are explicitly contemplated herein. The primary isolation well layer 30 has a doping of the second conductivity type. The dopant concentration of the primary isolation well layer 30 is from about $3.0\times10^{15}/cm^3$ to about $1.0\times10^{21}/cm^3$, and typically from about $1.0\times10^{16}/cm^3$ to about $3.0\times10^{18}/cm^3$, although lesser and greater doping concentrations are also explicitly contemplated herein.

The vertical stack of the body layer 50, the bottom electrode layer 40, and the primary isolation well layer 30 may be formed concurrently with other semiconductor devices requiring the same vertical doping profile. For example, complementary metal-oxide-semiconductor (CMOS) devices employing a hyperabrupt junction may be formed concurrently with the formation of the vertical stack. The term "hyperabrupt junction" is used to denote a type of pn junction in which a dopant concentration profile changes in a controlled non-linear way with density of the dopants increasing towards the junction and abruptly dropping to zero at the junction. Varactors that include an ion-implanted hyperabrupt junction are known in the art as "hyperabrupt junction varactors". See, for example, U.S. Pat. No. 4,226,648 to Goodwin, et al., U.S. Pat. No. 4,827,319 to Pavlidis, et al, U.S. Pat. No. 5,557,140 to Nguyen, et al. and U.S. Pat. No. 6,521,506 to Coolbaugh, et al. The methods of forming semiconductor structures including a hyperabrupt junction are described in commonly-assigned, copending U.S. patent application Ser. Nos. 10/905,486 (Pub. No. US2006/0145300A1) and 11/004,877 (Pub. No. US2005/0161770A1), the contents of which are incorporated herein by reference.

The first implantation mask 17 is removed after formation of the vertical stack of the body layer 50, the bottom electrode layer 40, and the primary isolation well layer 30 by methods known in the art, for example, by ashing.

Figure 4:
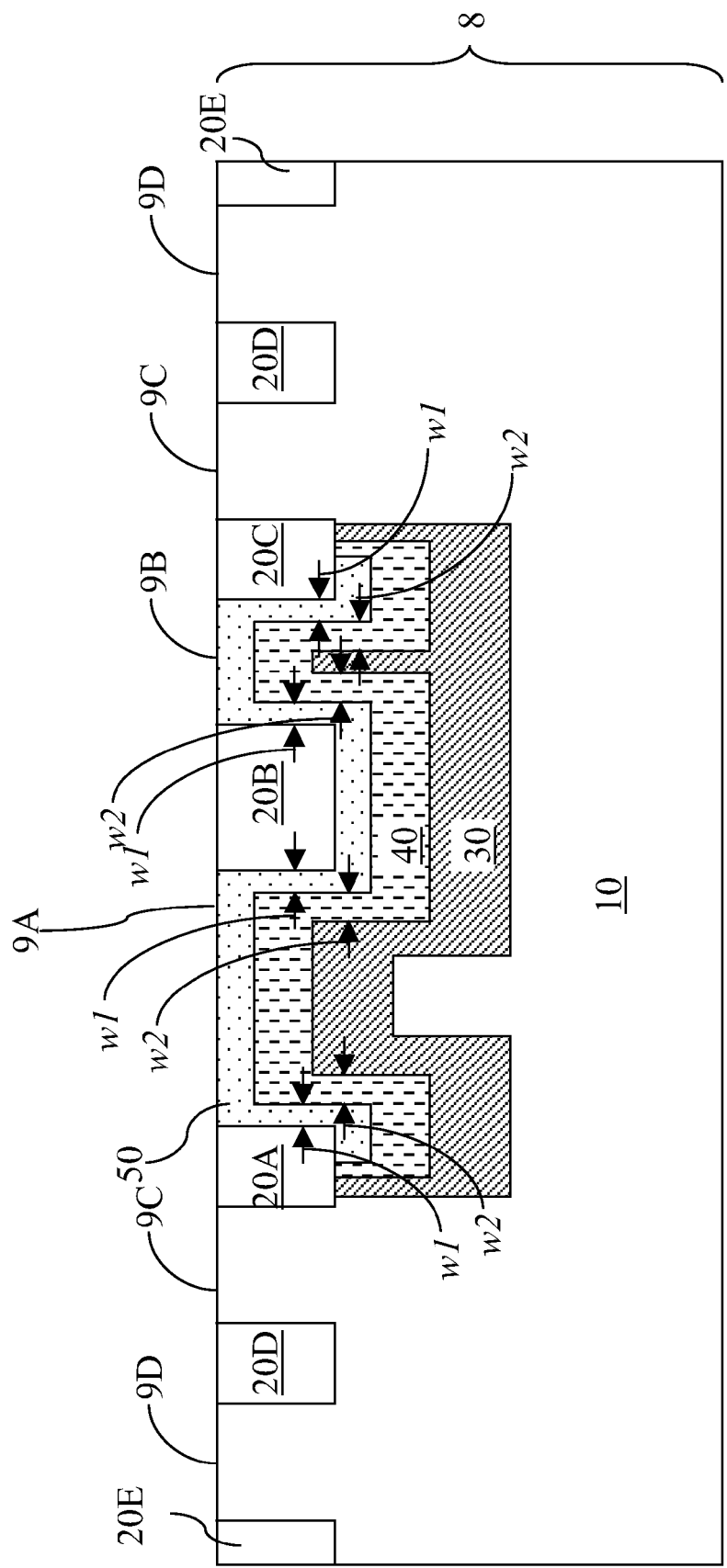

Referring to FIG. 4, a shallow trench isolation (STI) structure including a first shallow trench isolation (STI) portion 20A, a second STI portion 20B, a third STI portion 20C, at least one, fourth STI portion 20D, and at least one fifth STI portion 20E. The first STI portion 20A is formed in the first shallow trench portion 19A; the second STI portion 20B is formed in the second shallow trench portion 19B, the third STI portion 20C is formed in the third shallow trench portion 19C, the at least one, fourth STI portion 20D is formed in the at least one, fourth shallow trench portion 19D, and the at least one fifth STI portion 20E is formed in the at least one fifth shallow trench portion 19E. The shallow trench isolation portions (20A-20E) comprise a dielectric material such as silicon oxide. Methods known in the art, such as high density plasma chemical vapor deposition (HDPCVD) of a dielectric material followed by chemical mechanical polishing (CMP), maybe employed to form the shallow trench isolation portions (20A-20E). Top surfaces of each of the shallow trench isolation portions (20A-20E) are substantially coplanar amongst one another, and may be coplanar with, raised above, or recessed below, various portions of the semiconductor top surface (9A-9D).

The body layer 50 may have substantially the same width on a sidewall of the first STI portion 20A, sidewalls of the second STI portion 20B, and a sidewall of the third STI portion 20C, which is herein referred to as a first width w1. The bottom electrode layer 40 may have substantially the same width on sidewalls of the body layer 50 on the first STI portion 20A, the second STI portion 20B, and the third STI portion 20C, which is herein referred to as the second width. Lateral straggle of implanted dopants and/or angled ion implantation are employed to control the first width w1 and the second width w2. Depending on relative width of the first surface region 9A to the first width w1 and the second width w2, a bottom surface of the primary isolation well layer 30 may be raised between the first STI portion 20A and the second STI portion 20B relative to another bottom surface of the primary isolation well layer 30 beneath the first and second STI portions (20A, 20B).

Figure 5A:
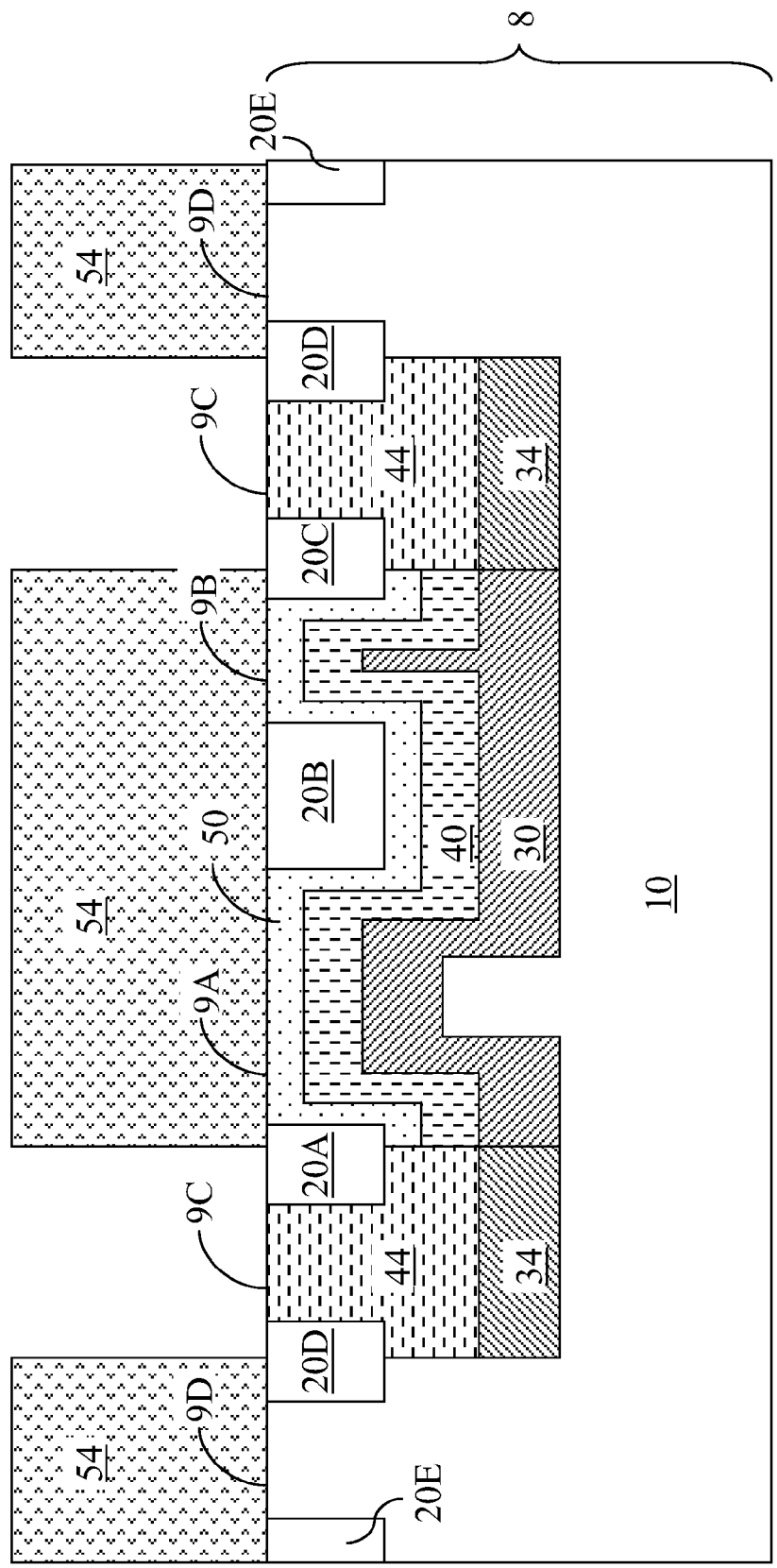

Referring to FIG. 5A, a second implantation mask 54, which may be a layer of photoresist, is formed on the semiconductor top surface (9A-9D) and lithographically patterned such that the at least one, third surface region 9C is exposed, while the first surface region 9A, the second surface region 9B, and the at least one, fourth surface region 9D are covered by the second implantation mask 54.

A series of ion implantation steps are performed employing the second implantation mask 54 to deliver dopants through the at least one, third surface region 9C into the substrate layer 10, while preventing implantation of the ions into the substrate layer 10 in regions covered by the second implantation mask 54. A bottom electrode contact well 44 and a secondary isolation well layer 34 are formed in the substrate layer 10. Each of the bottom electrode contact well 44 and the secondary isolation well layer 34 may be of unitary construction, i.e., formed in one contiguous piece, or may comprise multiple disjoined portions. The bottom electrode contact well 44 laterally abuts the body layer 50 and the bottom electrode layer 40 beneath a bottom surface of the first STI portion 20A and beneath a bottom surface of the third STI portion 20C. The bottom electrode contact well 44 may vertically extend from the at least one, third surface region 9C into the semiconductor substrate 8 to a depth about the bottom surface of the bottom electrode layer 40 beneath the first STI portion 20A and the third STI portion 20C. The bottom electrode contact well 44 has a doping of the first conductivity type. The dopant concentration of the bottom electrode contact well 44 is from about $3.0\times10^{15}/cm^3$ to about $3.0\times10^{19}/cm^3$, and typically from about $1.0\times10^{16}/cm^3$ to about $3.0\times10^{18}/cm^3$. The dopant concentration of the bottom electrode contact well 44 may be substantially the same as the dopant concentration of the bottom electrode layer 40.

The secondary isolation well layer 34 laterally abuts a primary isolation well layer, and vertically abuts a bottom surface of the bottom electrode contact well 44. Sidewalls of the secondary isolation well layer 34 is substantially coincidental with sidewalls of the bottom electrode contact well 44. The thickness of the secondary isolation well layer 34 may be substantially the same as the third thickness t3 in FIG. 2, and a bottom surface of the secondary isolation well layer 34 may be at a substantially same depth as a bottom surface of the primary isolation well layer 30 beneath the first STI portion 20A or beneath the third STI portion 20C. The secondary isolation well layer 34 has a doping of the second conductivity type. The dopant concentration of the secondary isolation well layer 34 is from about $3.0 \times 10^{15}/cm^3$ to about $1.0 \times 10^{21}/cm^3$, and typically from about $1.0 \times 10^{16}/cm^3$ to about $3.0 \times 10^{18}/cm^3$. The dopant concentration of the secondary isolation well layer 34 may be substantially the same as the dopant concentration of the primary isolation well layer 30. The second implantation mask 54 is removed thereafter by methods known in the art, for example, by ashing.

Figure 5B:
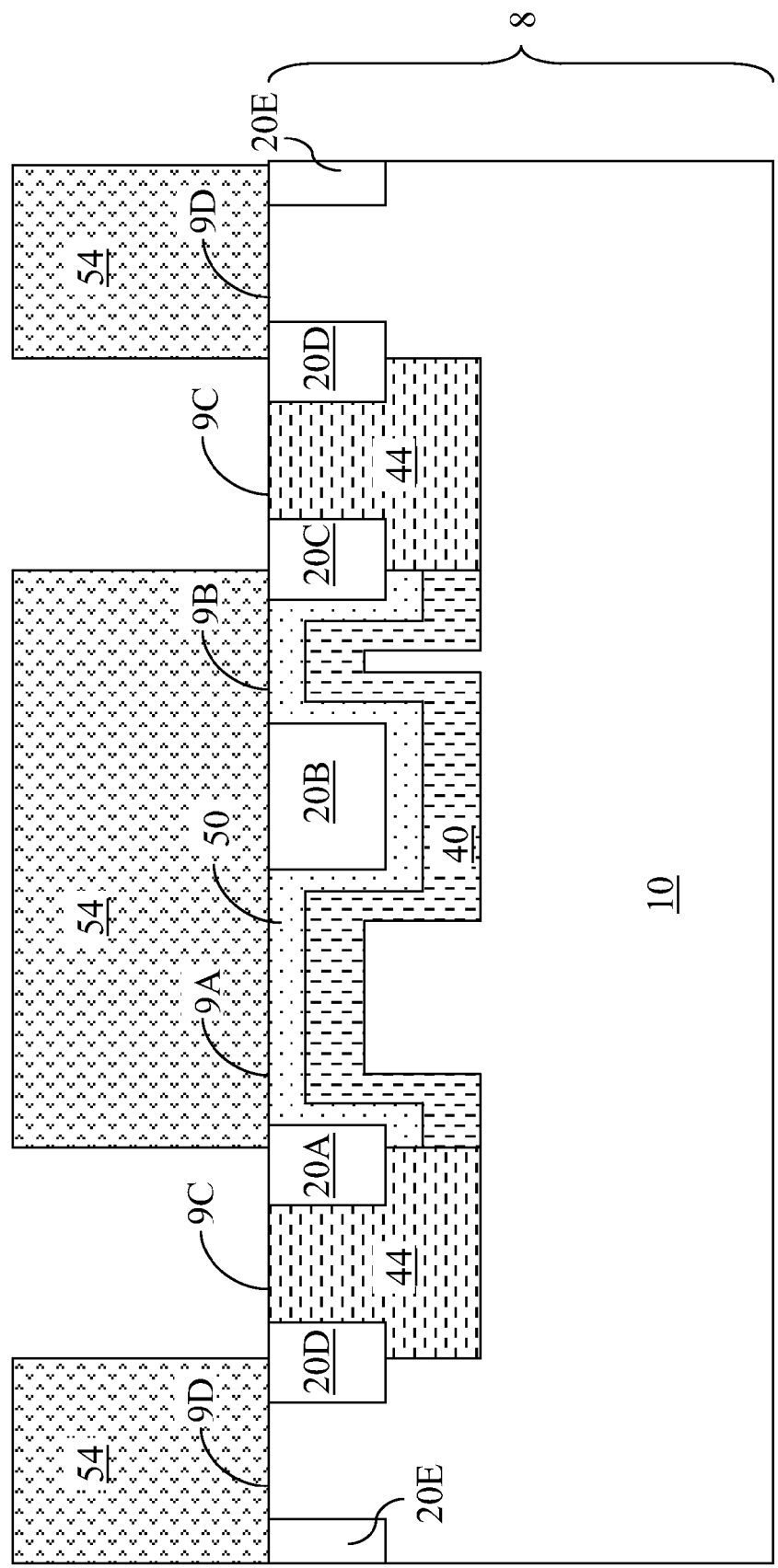
FIGS. 5B, 5C, and 11B are variations on the exemplary semiconductor structure.

Referring to FIG. 5B, a variation on the first exemplary semiconductor structure is shown, in which the substrate layer 10 has an opposite type of doping than the bottom electrode layer 40 and the bottom electrode contact well 44. For example, the substrate layer 10 may have a p-type doping and the bottom electrode layer 40 and the bottom electrode contact well 44 may have an n-type doping. Alternately, the substrate layer 10 may have an n-type doping and the bottom electrode layer 40 and the bottom electrode contact well 44 may have a p-type doping. A primary isolation well layer or a secondary isolation well layer is not necessary in this case since a reverse biased p-n junction may be formed between the substrate layer 10 and combined region of the bottom electrode layer 40 and the bottom electrode contact well 44.

Figure 5C:
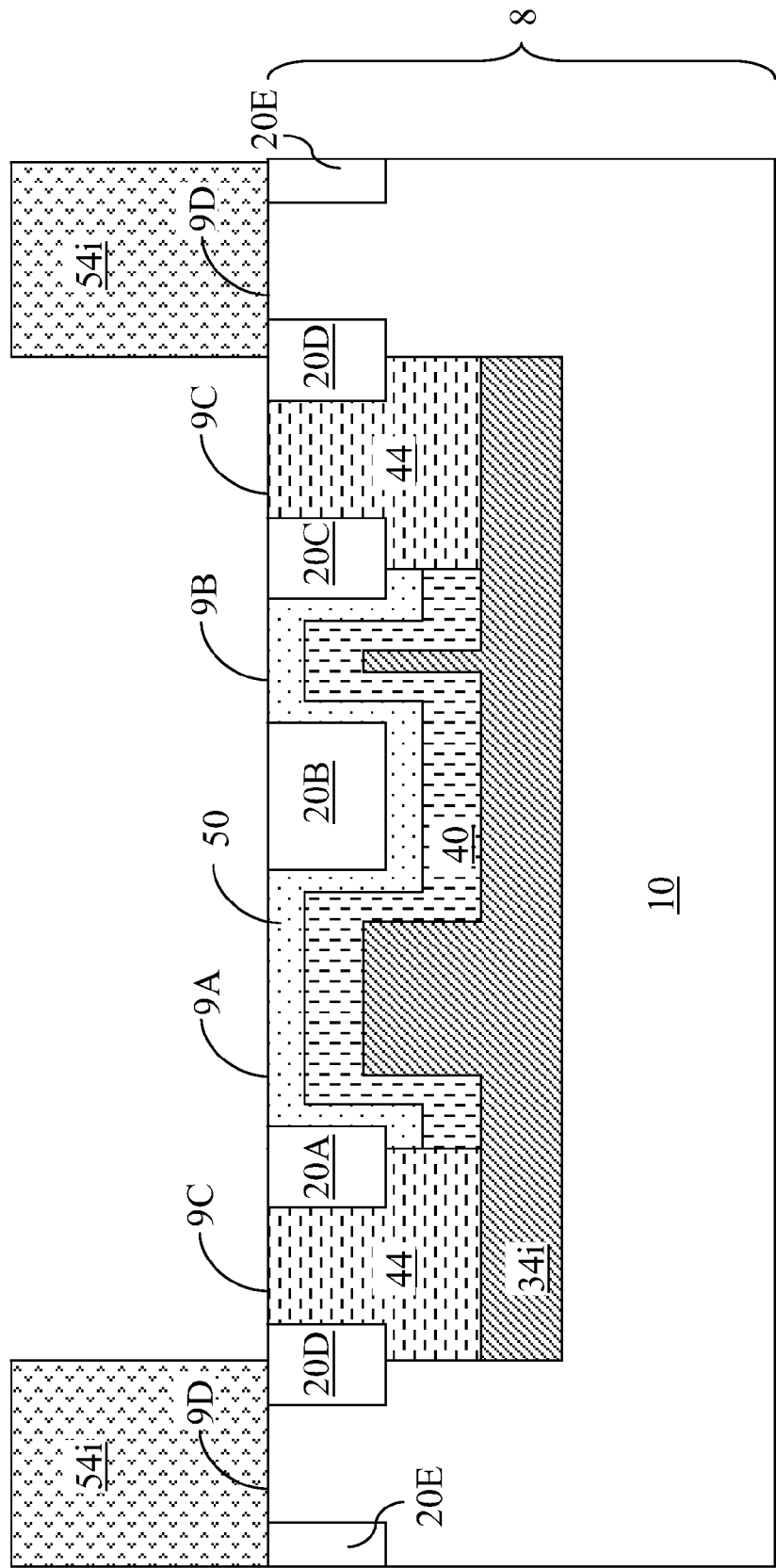

Referring to FIG. 5C, another variation on the first exemplary semiconductor structure is shown, in which a single primary isolation well layer 34*i* formed directly beneath the bottom electrode layer 40 and the bottom electrode contact region 44. The single primary isolation well layer 34*i* has a doping of the second conductivity type and has a constant depth from the top surface of the semiconductor substrate 8.

Figure 6:
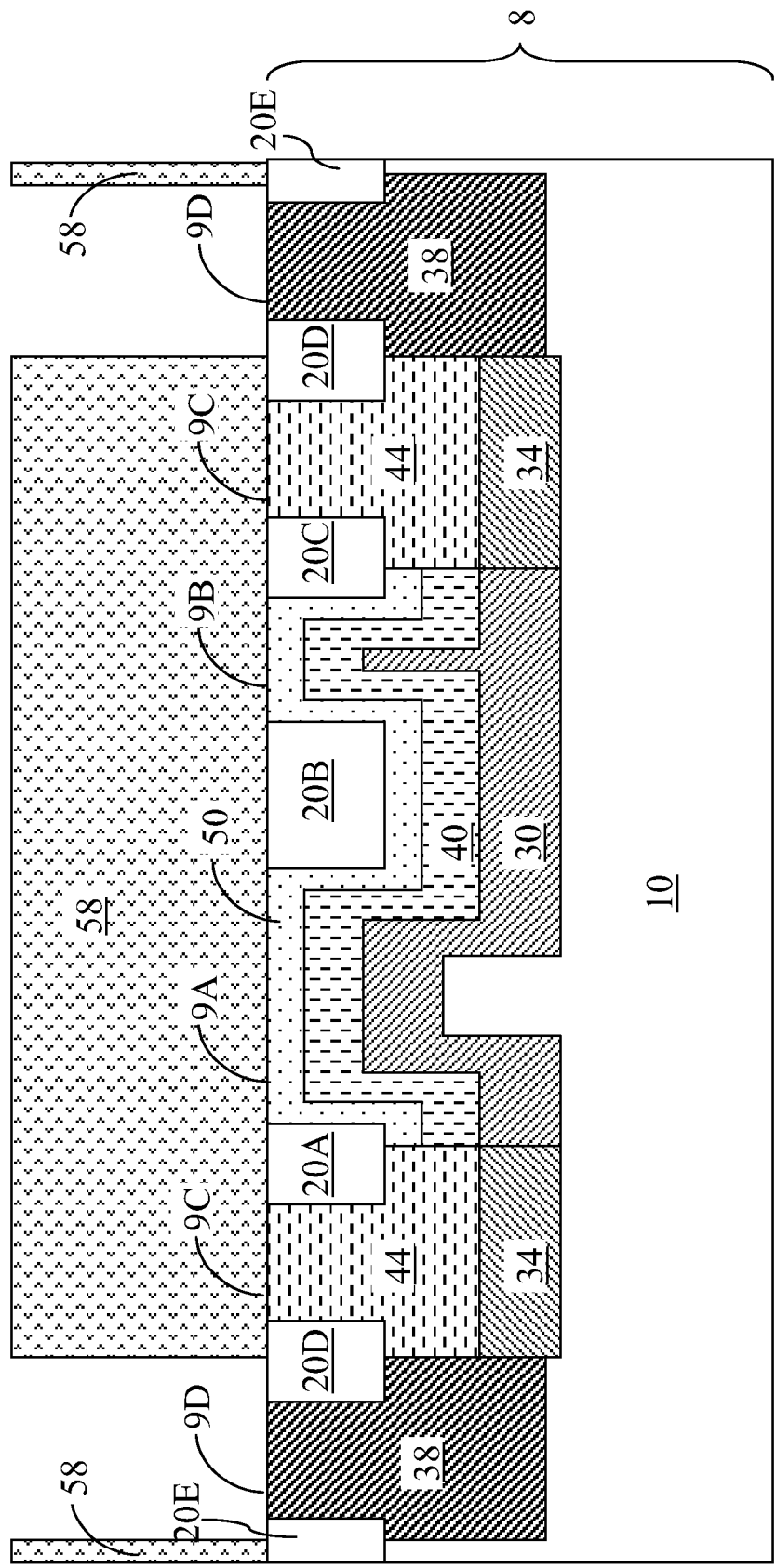

Referring to FIG. 6, a third implantation mask 58, which may be a layer of photoresist, is formed on the semiconductor top surface (9A-9D) and lithographically patterned such that the at least one, fourth surface region 9D is exposed, while the first surface region 9A, the second surface region 9B, and the at least one, third surface region 9C are covered by the third implantation mask 58.

Ion implantation is performed employing the third implantation mask 54 to deliver dopants through the at least one, fourth surface region 9D into the substrate layer 10, while preventing implantation of the ions into the substrate layer 10 in regions covered by the third implantation mask 54. An isolation layer contact well 38 is formed in the substrate layer 10. The isolation layer contact well 38 may be of unitary construction, i.e., formed in one contiguous piece, or may comprise multiple disjoined portions. The isolation layer contact well 38 laterally abuts the bottom electrode contact well 44 and the secondary well isolation layer 34. The isolation layer contact well 38 may vertically extend from the at least one, fourth surface region 9D into the semiconductor substrate 8 to a depth about the bottom surface of the secondary isolation well layer 34. The isolation layer contact well 38 has a doping of the second conductivity type. The dopant concentration of the isolation layer contact well 38 is from about $3.0 \times 10^{15}/cm^3$ to about $1.0 \times 10^{21}/cm^3$, and typically from about $1.0 \times 10^{16}/cm^3$ to about $3.0 \times 10^{18}/cm^3$, although lesser and greater dopant concentrations are explicitly also contemplated herein. The dopant concentration of the isolation layer contact well 38 may be substantially the same as the dopant concentration of the secondary well isolation layer 34.

Figure 7:
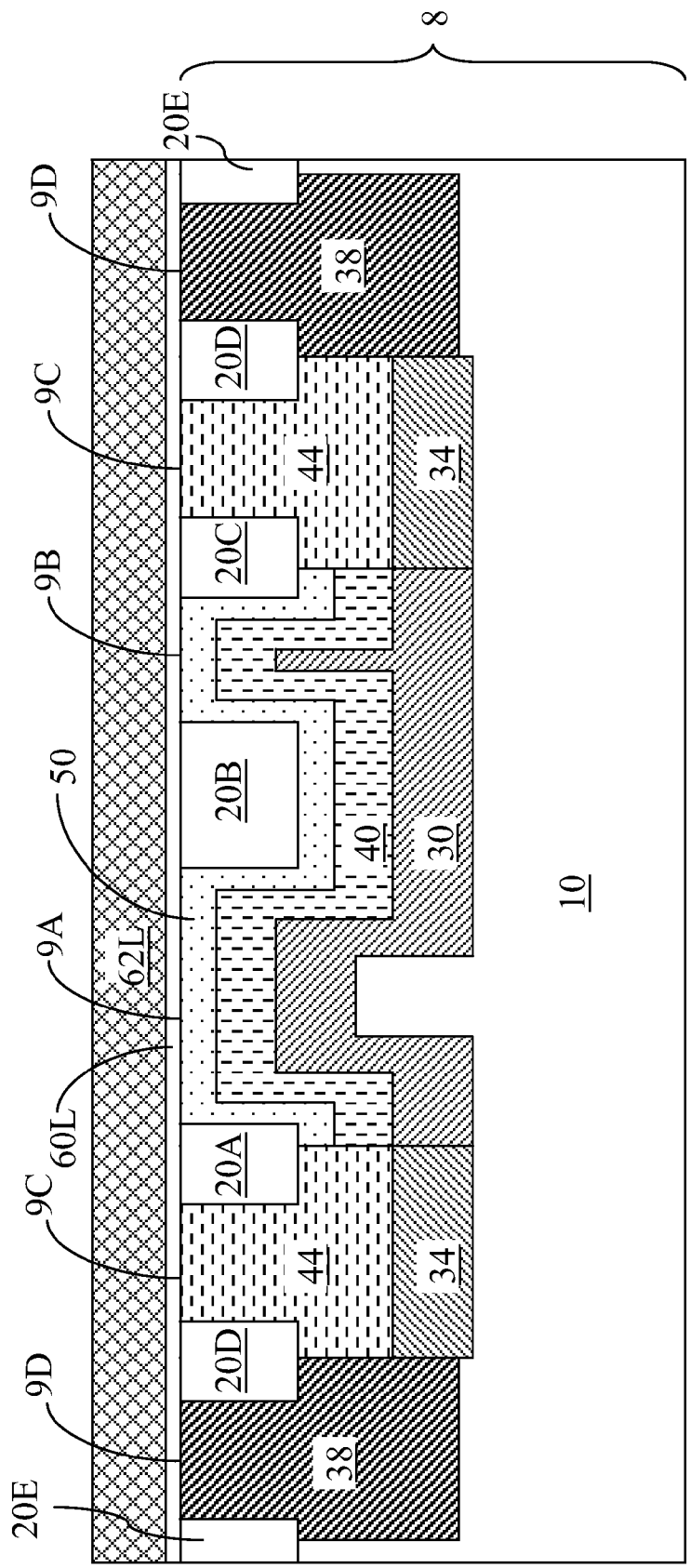

Referring to FIG. 7, a gate dielectric layer 60L is formed on the exposed semiconductor surfaces including the semiconductor top surface (9A-9D). In case the gate dielectric layer 60L comprises a high-k gate dielectric material such as $HfO_2$, $ZrO_2$, $Al_2O_3$, $TiO_2$, $La_2O_3$, $SrTiO_3$, $LaAlO_3$, $Y_2O_3$, silicates thereof, and mixtures thereof, which may be formed by chemical vapor deposition, the gate dielectric layer is formed on the entire top surface of the semiconductor substrate 8 including top surfaces of the shallow trench isolation portions (20A-20E). In case the gate dielectric layer 60L is formed by thermal conversion of a semiconductor material comprising a semiconductor oxide or oxynitride, the gate dielectric layer may be formed only on the semiconductor top surface and not on the top surfaces of the shallow trench isolation portions (20A-20E).

A gate electrode layer 62L is formed on the gate dielectric layer 60L. The gate electrode layer 62L comprises a conductive material, which may be one of metal gate materials or a doped semiconductor material such as doped polysilicon. Methods of forming the gate electrode layer 62L are known in the art.

Figure 8:
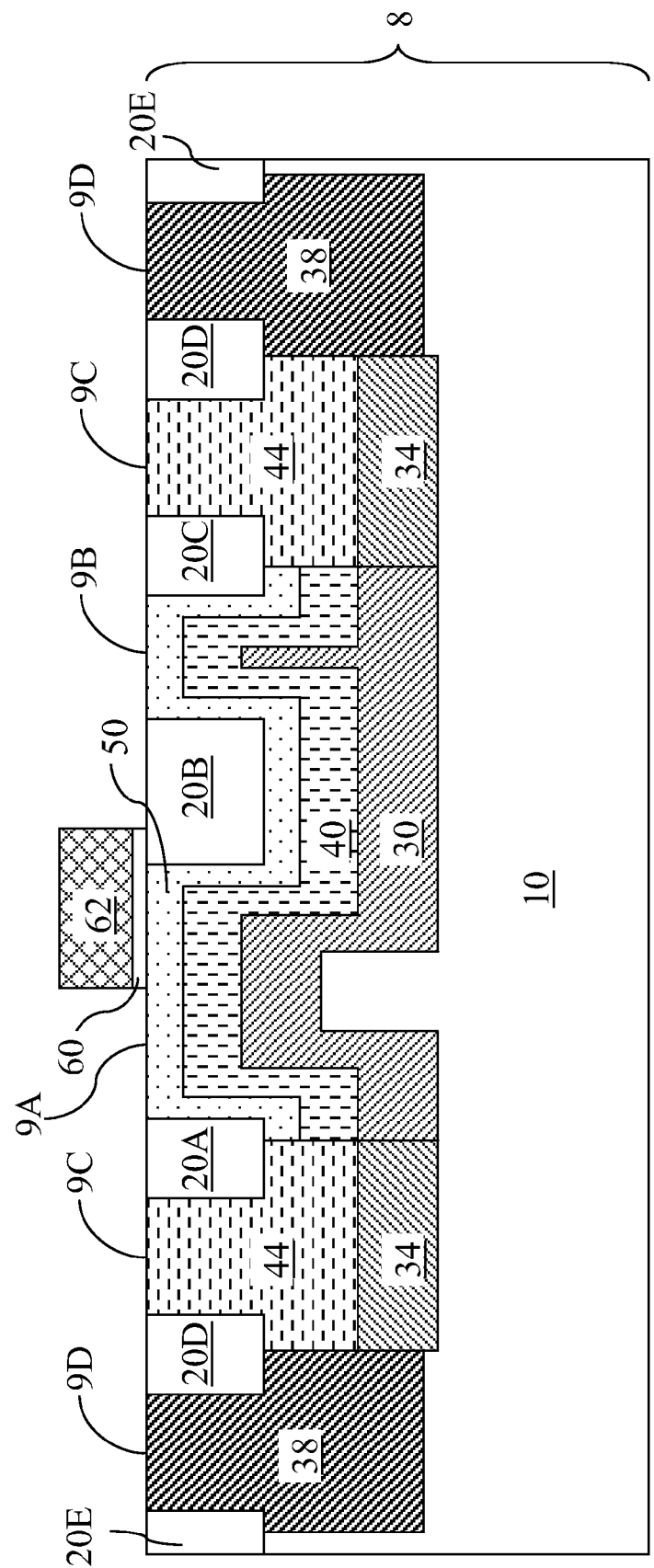

Referring to FIG. 8, the gate electrode layer 62L and the gate dielectric layer 60 are patterned such that a stack of a gate dielectric 60 and a top gate electrode 62 is formed on the portion of the first surface region 9A. Preferably, the gate dielectric 60 is disjoined from the first STI portion 20A. The gate dielectric 60 may straddle the interface between the first surface region 9A and the second STI region 20B. The gate dielectric 60 does not directly contact the second surface region 9B.

Gate spacers (not shown) may be formed as needed.

Figure 9:
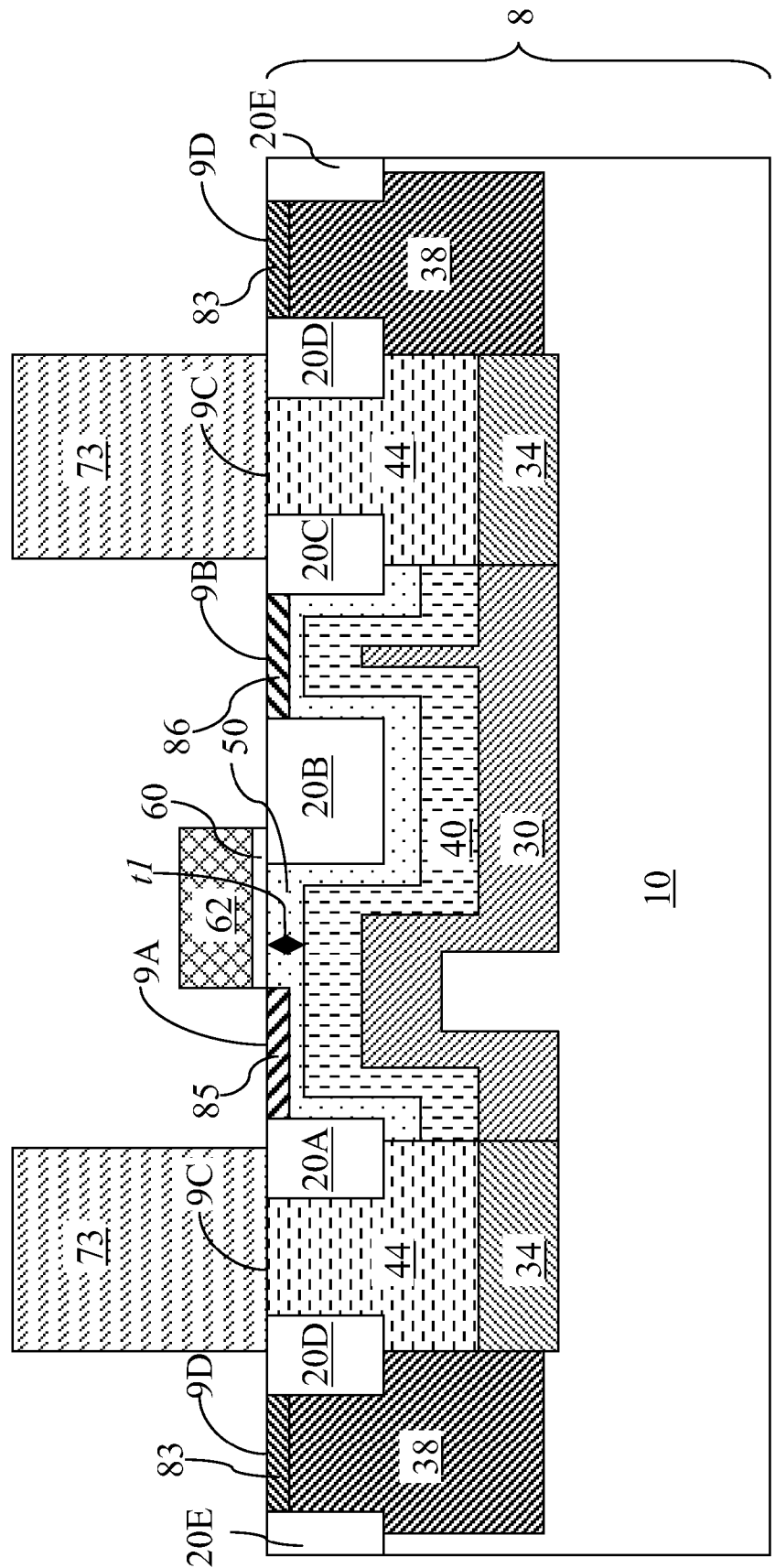

Referring to FIG. 9, a fourth implantation mask 73, which may be a layer of photoresist, is formed on the semiconductor top surface (9A-9D) and lithographically patterned such that the at least one, third surface region 9C is covered by the fourth implantation mask 73, while the first surface region 9A, the second surface region 9B, and the at least one, fourth surface region 9D are exposed.

Dopants of the second conductivity type are implanted into the exposed portions of the semiconductor substrate 12 to form a source region 85 directly underneath exposed portions of the first surface region 9A, a drain region 86 directly underneath the second surface region 9B, and at least one isolation layer contact region 83 directly underneath the at least one, fourth surface region 9D. The at least one isolation layer contact region 83 may be of unitary construction, i.e., formed in one contiguous piece, or may comprise multiple disjoined portions.

The depth of each of the source region 85, the drain region 86, the at least one isolation layer contact region 83 can be less than the first thickness t1, which is the thickness of the body layer 50, or it can be more than the first thickness t1, but less than the sum of the first thickness t1 and second thickness t2 such that it does not electrically short the body layer 50 and isolation layer 30. The depth of each of the source region 85, the drain region 86, and the at least one isolation layer contact region 83 may be the same, and may be from about 20 nm to about 300 nm, and preferably from about 80 nm to about 200 nm. The dopant concentration of each of the source region 85, the drain region 86, and the at least one isolation layer contact region 83 may be from about $3.0 \times 10^{19}/cm^3$ to about $3.0 \times 10^{21}/cm^3$, and typically from about $1.0 \times 10^{20}/cm^3$ to about $5.0 \times 10^{20}/cm^3$, although lesser and greater dopant concentrations are also explicitly contemplated herein.

The formation of the source region 85, the drain region 86, and the at least one isolation layer contact region 83 may be concurrently be performed with formation of other source and drain regions of other semiconductor devices such as a field effect transistor of the second conductivity type. The fourth implantation mask 73 is subsequently removed.

Figure 10:
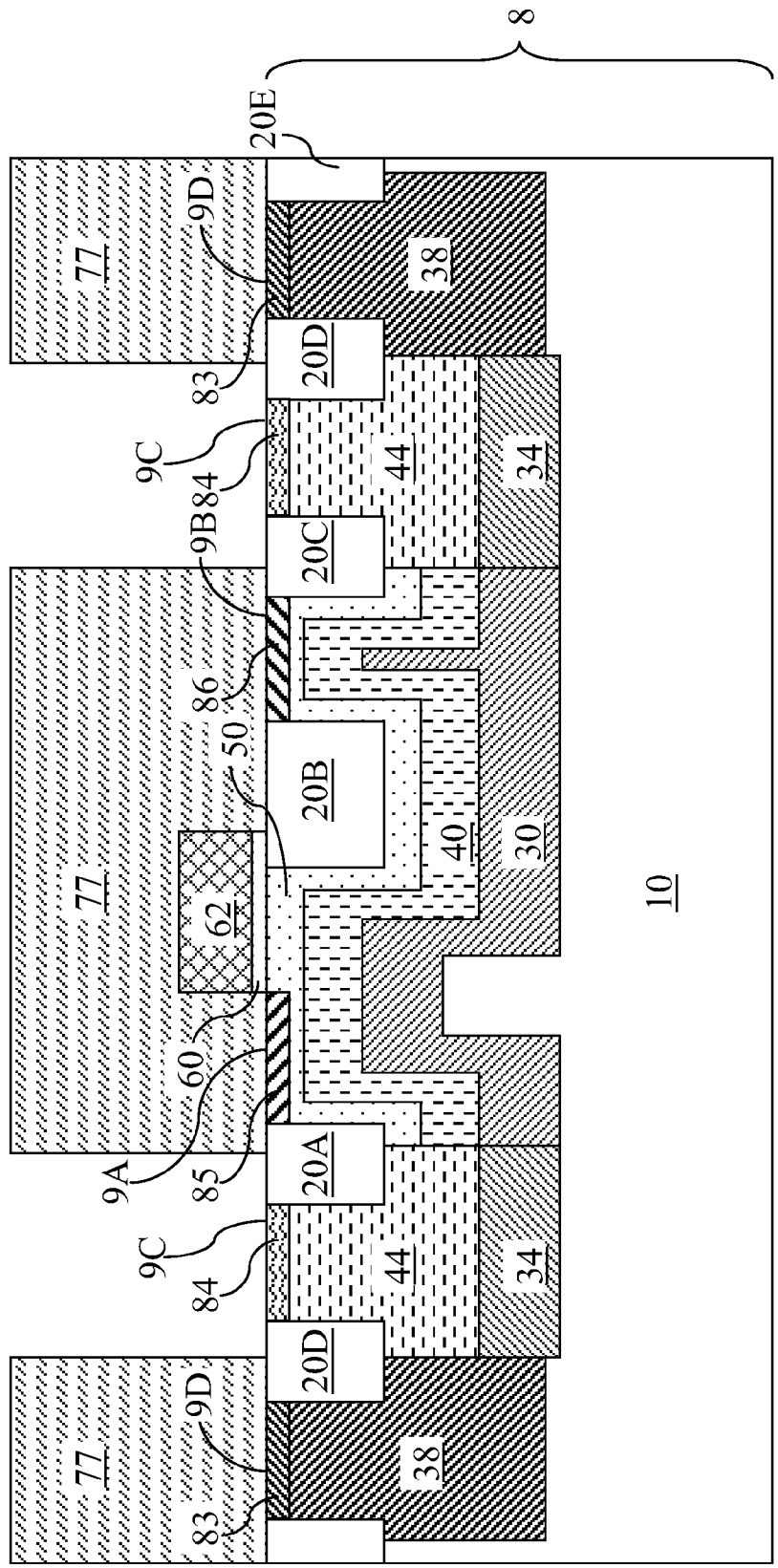

Referring to FIG. 10, a fifth implantation mask 77, which may be a layer of photoresist, is formed on the semiconductor top surface (9A-9D) and lithographically patterned such that the at least one, third surface region 9C is exposed, while the first surface region 9A, the second surface region 9B, and the at least one, fourth surface region 9D are covered by the fifth implantation mask 77.

Dopants of the first conductivity type are implanted into the exposed portions of the semiconductor substrate 12 to form at least one bottom electrode contact region 84 directly underneath the at least one, third surface region 9C. The at least one bottom electrode contact region 84 may be of unitary construction, i.e., formed in one contiguous piece, or may comprise multiple disjoined portions.

The depth of each of the at least one bottom electrode contact region 84 may be from about 20 nm to about 300 nm, and preferably from about 80 nm to about 200 nm. The dopant concentration of the at least one bottom electrode contact region 84 may be from about $3.0 \times 10^{19}/cm^3$ to about $3.0 \times 10^{21}/cm^3$, and typically from about $1.0 \times 10^{20}/cm^3$ to about $5.0 \times 10^{20}/cm^3$, although lesser and greater dopant concentrations are also explicitly contemplated herein.

The formation of the at least one bottom electrode contact region 84 may be concurrently be performed with formation of yet other source and drain regions of yet other semiconductor devices such as a field effect transistor of the first conductivity type. The fifth implantation mask 77 is subsequently removed.

Figure 11A:
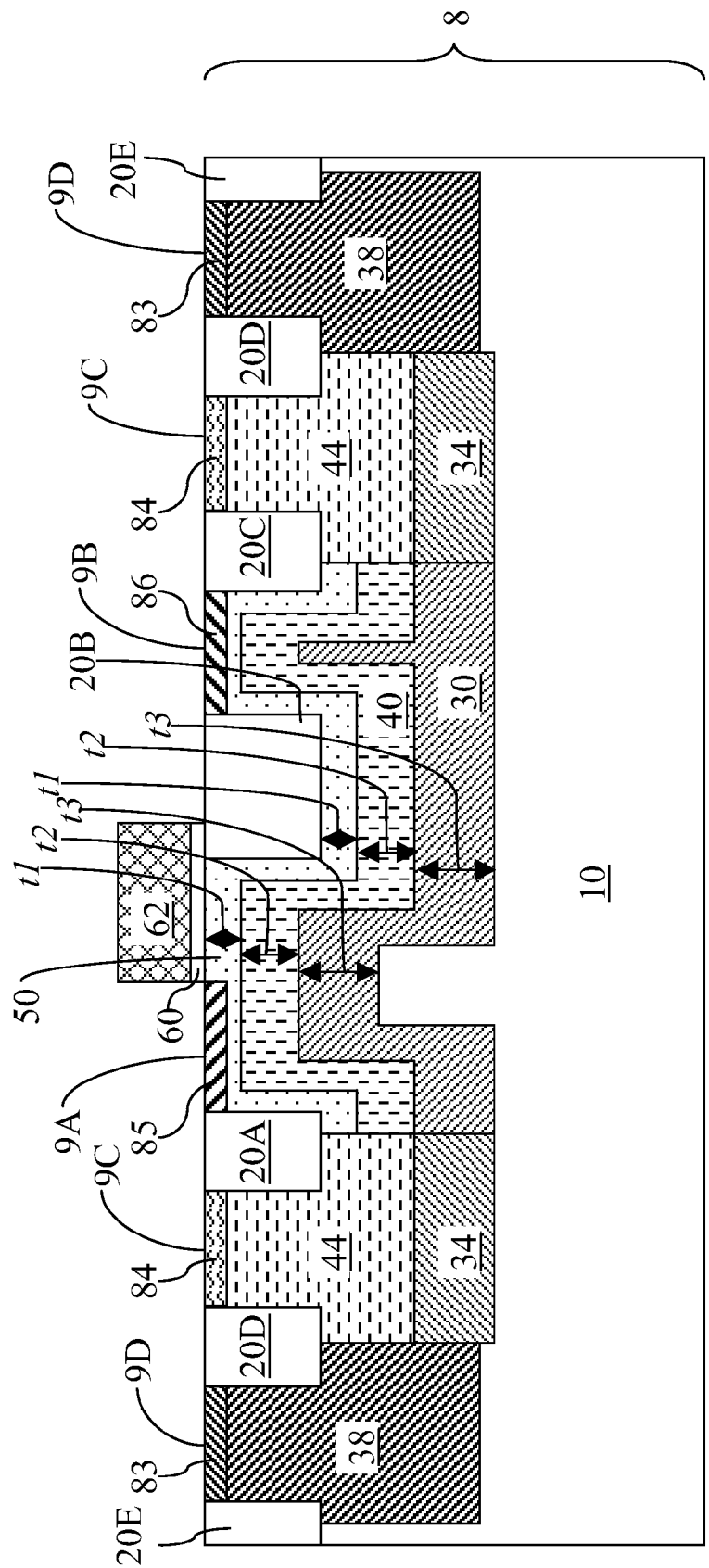

Referring to FIG. 11A, the exemplary semiconductor structure comprises an inventive metal-oxide-semiconductor field effect transistor having a source region 85 and a drain region 86, each having a doping of the second conductivity type. The body layer 50 has a doping of the second conductivity type at a lower dopant concentration than the dopant concentration of the source region 85 and the drain region 86. The bottom electrode layer 40 located directly underneath the body layer 50 may provide full depletion of the body layer 50 upon application of suitable electrical bias. The primary isolation well layer 30, the secondary isolation well layer 34, and isolation layer contact well provide electrical isolation of the components within including the bottom electrode layer 40 from the substrate layer 10 by forming a p-n-p junction or an n-p-n junction with adjoined layers.

The exemplary semiconductor structure of FIG. 11A comprises:

a first shallow trench isolation (STI) portion 20A and a second STI portion 20B, wherein the first STI portion 20A and the second STI portion 20B are located beneath a substrate top surface 9 (See FIG. 1) of a semiconductor substrate 8 and separated from each other;

a body layer 50 comprising a semiconductor material, and abutting a surface region, which is the first surface region 9A, of the substrate top surface 9 between the first STI portion 20A and the second STI portion 20B, a bottom surface of the second STI portion 20B, and a pair of sidewalls of the second STI portion 20B directly adjoined to opposite ends of the bottom surface of the second STI portion 20B;

a bottom electrode layer 40 comprising the semiconductor material, vertically abutting the body layer 50, located in the semiconductor substrate 8;

a gate dielectric 60 abutting the substrate top surface 9;

a top gate electrode 62 abutting the gate dielectric 60, wherein the bottom electrode layer 40 has a doping of a first conductivity type and the body layer 50 has a doping a second conductivity type, and wherein the second conductivity type is the opposite of the first conductivity type;

a source region 85 abutting the first STI portion 20A and the body layer 50;

a drain region 86 abutting the second STI portion 20B and another surface region of the substrate top surface 9, which is the second surface region 9B, wherein each of the source region 85 and the drain region 86 has a doping of the second conductivity type;

a bottom electrode contact well 44 laterally abutting the bottom electrode layer 40 and having a doping of the first conductivity type;

a bottom electrode contact region 84 vertically abutting the bottom electrode contact well 44 and yet another surface region of the substrate top surface 9, which is the at least one, third surface region 9C, and having a doping of the first conductivity type;

a primary isolation well layer 30 located directly beneath the bottom electrode layer 40 and having a doping of the second conductivity type;

a secondary isolation well layer 34 located directly beneath the bottom electrode contact region 44, laterally abutting the primary isolation well layer 40, and having a doping of the second conductivity type;

an isolation layer contact well 38 laterally abutting the secondary isolation well layer 34 and having a doping of the second conductivity type; and an isolation layer contact region 83 abutting the isolation layer contact well 38 and still another surface region of the substrate top surface 9, which is the at least one, fourth surface region 9D, and having a doping of the second conductivity type.

Figure 11B:
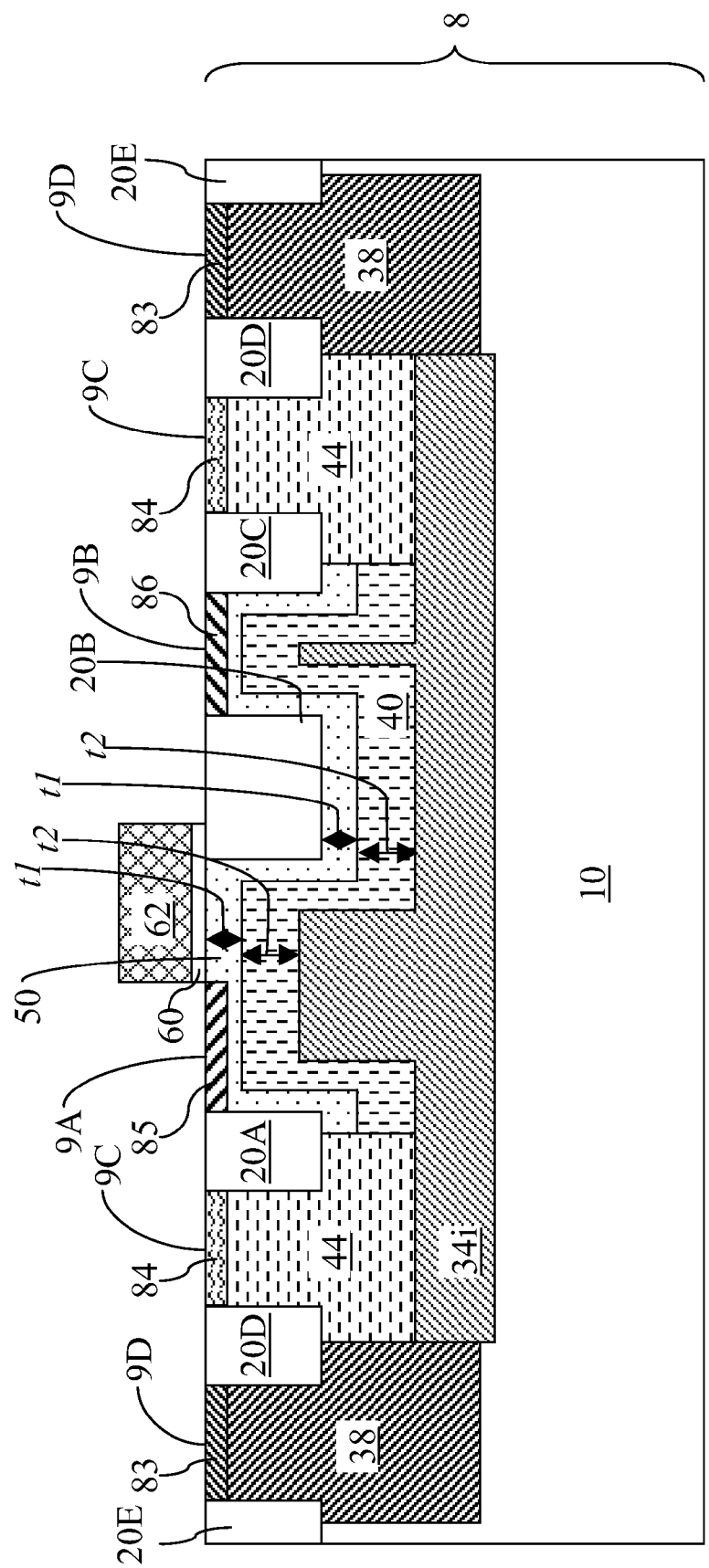

The exemplary semiconductor structure of FIG. 11B comprises:

a first shallow trench isolation (STI) portion 20A and a second STI portion 20B, wherein the first STI portion 20A and the second STI portion 20B are located beneath a substrate top surface 9 (See FIG. 1) of a semiconductor substrate 8 and separated from each other;

a body layer 50 comprising a semiconductor material, and abutting a surface region, which is the first surface region 9A, of the substrate top surface 9 between the first STI portion 20A and the second STI portion 20B, a bottom surface of the second STI portion 20B, and a pair of sidewalls of the second STI portion 20B directly adjoined to opposite ends of the bottom surface of the second STI portion 20B;

a bottom electrode layer 40 comprising the semiconductor material, vertically abutting the body layer 50, located in the semiconductor substrate 8;

a gate dielectric 60 abutting the substrate top surface 9;

a top gate electrode 62 abutting the gate dielectric 60, wherein the bottom electrode layer 40 has a doping of a first conductivity type and the body layer 50 has a doping a second conductivity type, and wherein the second conductivity type is the opposite of the first conductivity type;

a source region 85 abutting the first STI portion 20A and the body layer 50;

a drain region 86 abutting the second STI portion 20B and another surface region of the substrate top surface 9, which is the second surface region 9B, wherein each of the source region 85 and the drain region 86 has a doping of the second conductivity type;

a bottom electrode contact well 44 laterally abutting the bottom electrode layer 40 and having a doping of the first conductivity type;

a bottom electrode contact region 84 vertically abutting the bottom electrode contact well 44 and yet another surface region of the substrate top surface 9, which is the at least one, third surface region 9C, and having a doping of the first conductivity type;

a single primary isolation well layer 34*i* located directly beneath the bottom electrode layer 40 and the bottom electrode contact region 44 having a doping of the second conductivity type;

an isolation layer contact well 38 laterally abutting the secondary isolation well layer 34 and having a doping of the second conductivity type; and an isolation layer contact region 83 abutting the isolation layer contact well 38 and still another surface region of the substrate top surface 9, which is the at least one, fourth surface region 9D, and having a doping of the second conductivity type.

Figure 12:
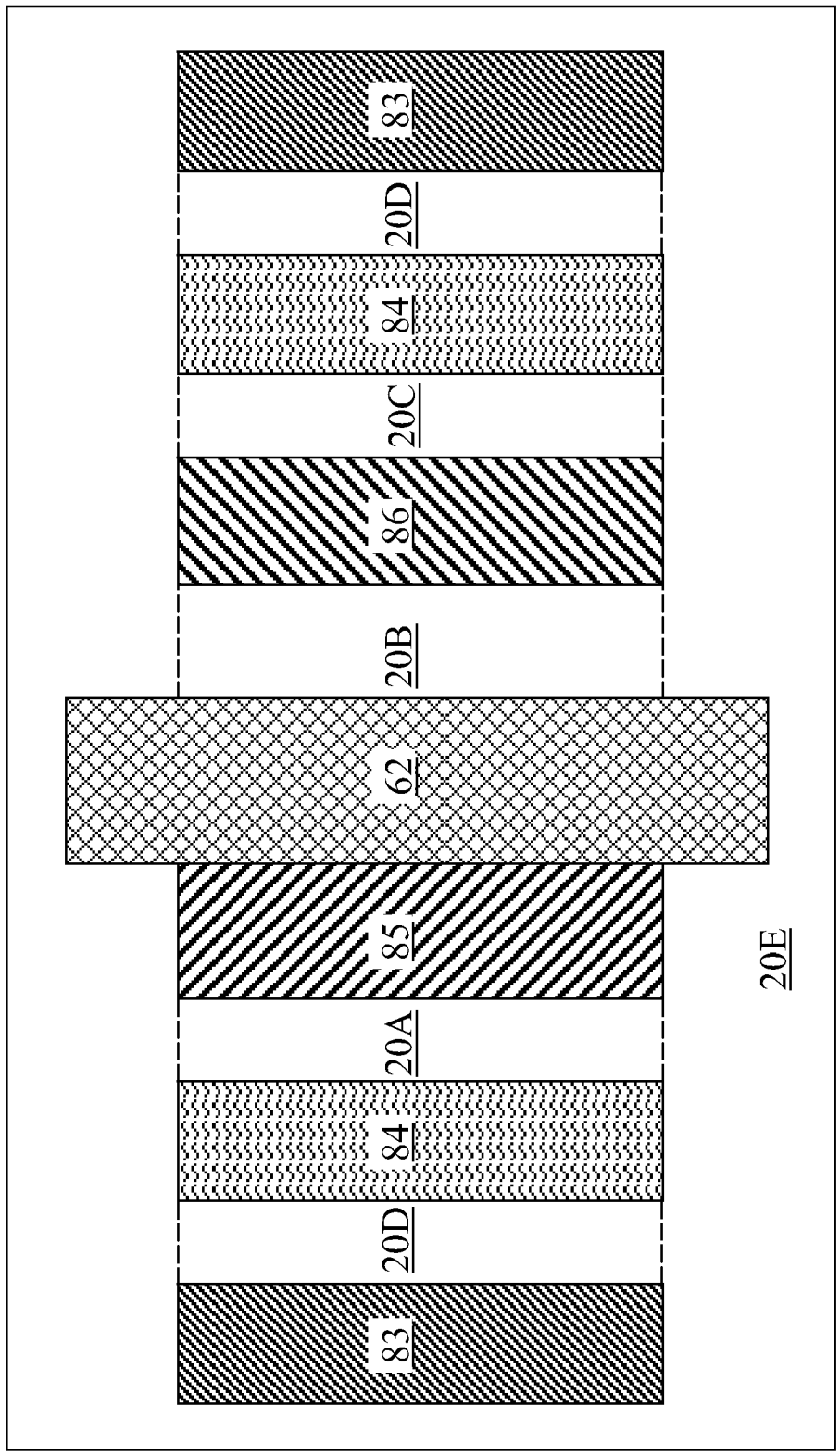
FIG. 12 is a top-down view of the exemplary semiconductor structure at a step corresponding to FIG. 10.

Referring to FIGS. 12, a top-down view of the exemplary semiconductor structure of FIG. 10 is shown, in which the shallow trench isolation portions (20A-20E) is of unitary construction and the boundary between the various STI portions (each of 20A-20E) are marked by dotted lines.

Figure 13:
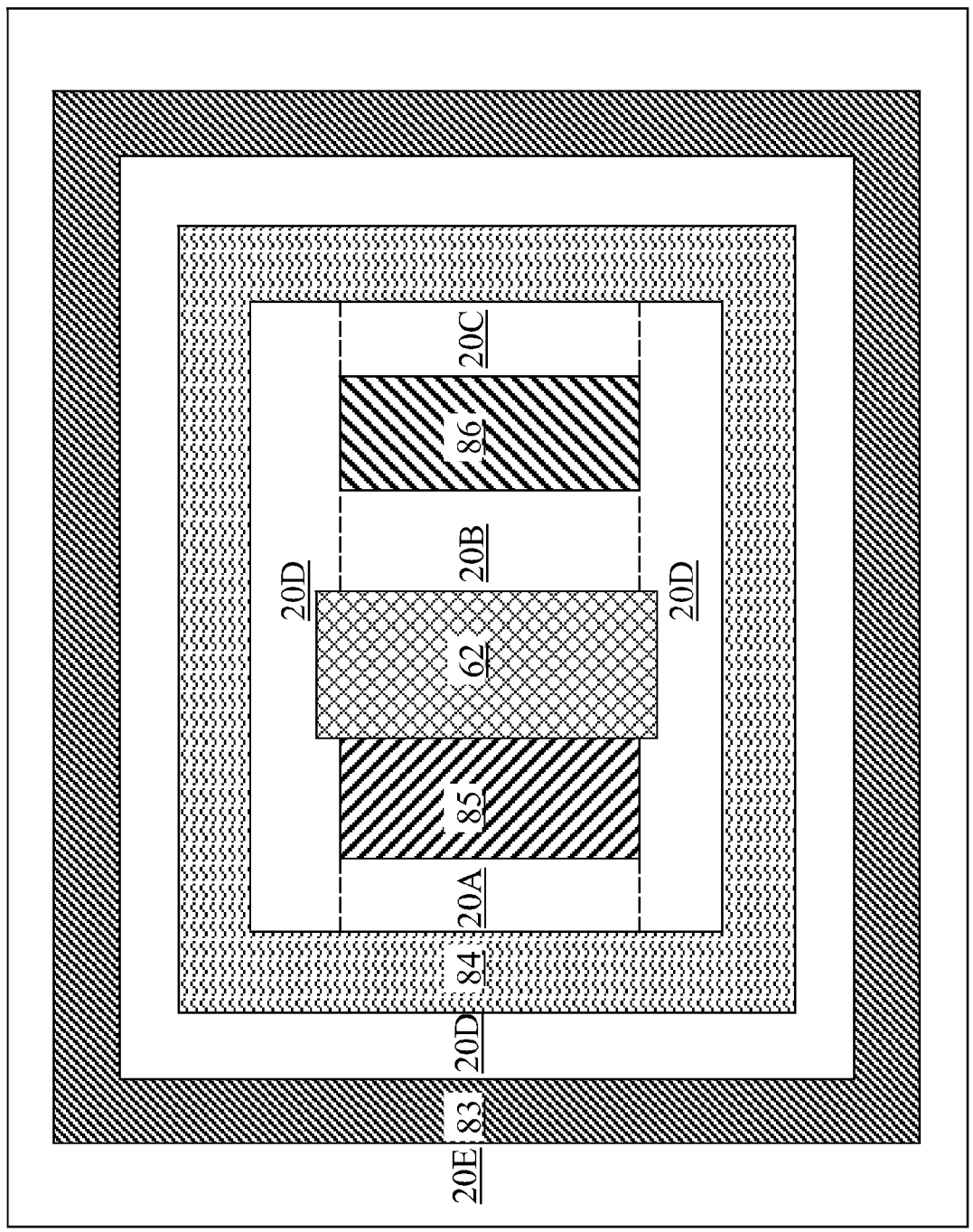
FIGS. 13 and 14 are top-down views of alternative exemplary semiconductor structures according to the present invention.
Figure 14:
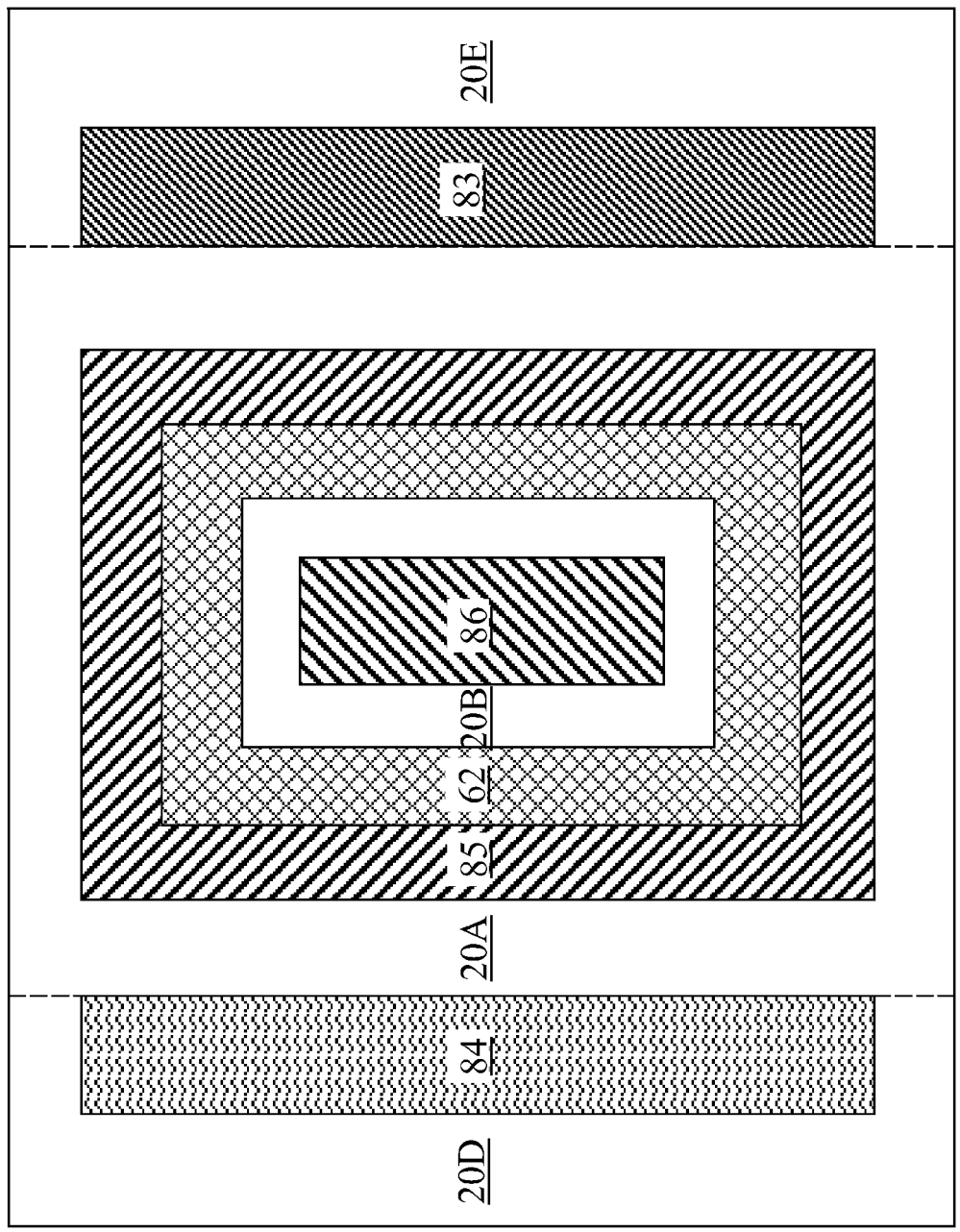

Referring to FIGS. 13 and 14, top-down views of alternative exemplary semiconductor structures according to the present invention are shown, in which the shallow trench isolation portions (20A-20E) are not of unitary construction, i.e., the shallow trench isolation portions (20A-20E) comprises multiple disjoined portions. Many different variations of the layout are possible.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:

forming a shallow trench including a first shallow trench portion and a second shallow trench portion in a semiconductor substrate, wherein said first shallow trench portion and said second shallow trench portion are separated by a first surface region of a semiconductor top surface;

forming a stack of a body layer, a bottom electrode layer, and a primary isolation well layer, wherein said body layer is located directly beneath said first surface region, a second surface region directly adjoining said second shallow trench portion, and a bottom surface of said second shallow trench portion, and wherein said bottom electrode layer is located directly beneath said body layer, and wherein said primary isolation layer is located directly beneath said bottom electrode layer, and wherein said bottom electrode layer has a doping of a first conductivity type, and wherein each of said body layer and said primary isolation well layer has a doping a second conductivity type, and wherein said second conductivity type is the opposite of said first conductivity type;

forming a shallow trench isolation (STI) structure including a first STI portion formed in said first shallow trench portion and a second STI portion formed in said second shallow trench portion; and forming a gate dielectric and a top gate electrode by patterning a stack of a gate dielectric layer and a gate electrode layer, wherein said gate dielectric is formed on a portion of said first surface region and said second STI portion.

2. The method of claim 1, wherein an angled ion implantation with four rotations is employed to form said body layer, wherein a body layer sidewall region of said body layer receives a dosage of dopant ions corresponding to only one rotation.

3. The method of claim 1, further comprising forming a patterned ion implantation mask on said semiconductor top surface prior to said forming said stack, wherein said first surface region of said semiconductor top surface, said second shallow trench portion, and a second surface region of said semiconductor top surface are exposed, wherein said second surface region directly adjoins a sidewall of said second shallow trench portion.

4. The method of claim 1, further comprising:

forming a source region and a drain region, wherein said source region is formed directly on said first STI portion and directly underneath said first surface region of said top surface; and forming a drain region directly on said second STI portion and directly underneath said second surface region of said substrate top surface, wherein said source region and said drain region are disjoined from said bottom electrode layer, wherein each of said source region and said drain region has a doping of said second conductivity type.

5. The method of claim 4, further comprising:

forming a bottom electrode contact well having a doping of said first conductivity type directly on said bottom electrode layer; and forming a secondary isolation well layer having a doping of said second conductivity type directly beneath said bottom electrode contact region and directly on said primary isolation well layer.

6. The method of claim 5, further comprising forming an isolation layer contact well having a doping of said second conductivity type directly on said secondary isolation well layer.

7. The method of claim 5, further comprising:

forming a bottom electrode contact region having a doping of the first conductivity type in said bottom electrode contact well and directly beneath a third surface region of said substrate top surface; and forming an isolation layer contact region having a doping of the second conductivity type in said isolation layer contact well and directly beneath a fourth surface region of said substrate top surface concurrently with said forming of said source region and the drain region.

8. The method of claim 1, wherein a first portion of said body layer vertically abutting said gate electrode and a second portion of said body layer vertically abutting said bottom surface of said second STI portion have a same first thickness, wherein a first portion of said bottom electrode layer vertically abutting said first portion of said body layer and a second portion of said bottom electrode layer vertically abutting said second portion of said body layer have a same second thickness, and wherein a first portion of said primary isolation well layer vertically abutting said first portion of said bottom electrode layer and a second portion of said primary isolation well layer vertically abutting said second portion of said bottom electrode layer have a same third thickness.

9. The method of claim 1, wherein said gate dielectric is formed directly on a top surface of said semiconductor substrate, wherein a portion of said top surface of said semiconductor substrate is located between said first STI portion and said second STI portion.

10. The method of claim 1, wherein said body layer contiguously extends between said first STI portion and said second STI portion upon formation of first STI portion and said second STI portion.

11. The method of claim 1, wherein said body layer comprises a first portion of a semiconductor material of said semiconductor substrate, and said bottom electrode layer comprises a second portion of said semiconductor material and vertically contacts said body layer.

12. The method of claim 11, further comprising:
    forming a source region comprising a third portion of said semiconductor material in said semiconductor substrate, wherein said source region has a doping of said second conductivity type and contacts said first STI portion; and
    forming a drain region comprising a fourth portion of said semiconductor material in said semiconductor substrate, wherein said drain region has a doping of said second conductivity type and contacts said second STI portion and a surface of said semiconductor substrate.

13. The method of claim 12, wherein an edge of said source region is aligned to an edge of said gate dielectric, and said drain region is laterally spaced from said gate dielectric upon formation of said source region and said drain region.

14. The method of claim 12, wherein said source region and said drain region are formed by implanting dopants of said second conductivity type into upper portions of said body layer.

15. The method of claim 1, wherein an angled ion implantation with four rotations is employed to form said body layer, wherein a body layer sidewall region of said body layer receives a dosage of dopant ions corresponding to only one rotation.

16. The method of claim 15, wherein a body layer top region of said body layer receives 100% of a total dosage of said angled ion implantation with four rotations.

17. The method of claim 15, wherein a body layer bottom region of said body layer receives a dosage corresponding to a percentage from about 55% to 100% of a total dosage of said angled ion implantation with four rotations.

18. The method of claim 15, wherein a body layer sidewall region receives a dosage corresponding to a percentage from about 5% to about 45% of a total dosage of said angled ion implantation with four rotations.

19. The method of claim 15, wherein a resistivity of a body layer sidewall region is from about 2 to 20 times greater than a resistivity of a body layer top region.

20. The method of claim 1, further comprising:
    forming a bottom electrode contact well laterally abutting said bottom electrode layer and having a doping of said first conductivity type;
    forming a bottom electrode contact region vertically abutting said bottom electrode contact well and yet another surface region of said substrate top surface and having a doping of said first conductivity type;
    forming a primary isolation well layer and a secondary isolation well layer, wherein said primary isolation well layer is present directly beneath said bottom electrode layer and has a doping of said second conductivity type, and said secondary isolation well layer is present directly beneath said bottom electrode contact region, laterally abuts said primary isolation well layer, and has a doping of said second conductivity type; and
    forming an isolation layer contact well laterally abutting said secondary isolation well layer and having a doping of said second conductivity type.

\* \* \* \* \*